United States Patent
Negoita et al.

(10) Patent No.: US 9,690,107 B2
(45) Date of Patent: Jun. 27, 2017

(54) DEVICE FOR WAVELENGTH COMBINING OF LASER BEAMS

(71) Applicant: TRUMPF LASER GMBH, Schramberg (DE)

(72) Inventors: Viorel C. Negoita, Plainsboro, NJ (US); Thilo Vethake, Cranbury, NJ (US); Alexander Killi, Trossingen (DE); Christoph Tillkorn, Villingendorf (DE); Stephan Strohmaier, Berlin (DE); Steffen Ried, Rottweil (DE); Yufeng Li, Plainsboro, NJ (US); Haiyan An, Plainsboro Township, NJ (US); Tobias Barnowski, Cranbury, NJ (US)

(73) Assignee: TRUMPF LASER GMBH, Schramberg (DE)

( * ) Notice: Subject to any disclaimer, the term of this patent is extended or adjusted under 35 U.S.C. 154(b) by 1030 days.

(21) Appl. No.: 13/833,974

(22) Filed: Mar. 15, 2013

(65) Prior Publication Data
US 2016/0161752 A1    Jun. 9, 2016

(51) Int. Cl.
*G02B 5/18*    (2006.01)
*G02B 27/44*    (2006.01)
(Continued)

(52) U.S. Cl.
CPC ..... *G02B 27/1086* (2013.01); *G02B 27/1006* (2013.01); *G02B 27/1073* (2013.01);
(Continued)

(58) Field of Classification Search
CPC ............ G02B 27/1006; G02B 27/1086; G02B 27/283; G02B 27/123; G02B 27/0101;
(Continued)

(56) References Cited

U.S. PATENT DOCUMENTS 5,513,201 A    4/1996    Yamaguchi et al.
5,825,551 A    10/1998    Clarkson et al.
(Continued)

FOREIGN PATENT DOCUMENTS

DE    WO 0148882 A1    7/2001
DE    WO 2006/045303 A2    5/2006
(Continued)

OTHER PUBLICATIONS

International Search Report dated Jun. 20, 2014 for PCT/EP2014/054860.
(Continued)

*Primary Examiner* — Jade R Chwasz
(74) *Attorney, Agent, or Firm* — Fish & Richardson P.C.

(57) ABSTRACT

A device for wavelength coupling of laser beams ($2a, \ldots 2n$) with different wavelengths ($\lambda_1, \ldots \lambda_n$), comprising: at least one laser source for generating a plurality of laser beams ($2a, \ldots, 2n$), and an overlapping device for spatial overlapping of the plurality of laser beams ($2a, \ldots, 2n$) for forming an overlapped laser beam with a plurality of wavelengths ($\lambda_1 \ldots \lambda_n$). The device has a feedback device arranged between the laser source and the overlapping device for feeding a radiation proportion of the laser beams ($2a, \ldots, 2n$) to be overlapped back to the laser source, the feedback device comprising a partially reflecting angle-dispersive optical element, in particular a partially reflecting diffraction grating. The overlapping device may, for example, be configured as a transmitting or reflecting diffraction grating whose optical properties are adapted to the optical properties of the partially reflecting diffraction grating to overlap the laser beams ($2a, \ldots, 2n$) in an essentially dispersion-free manner.

46 Claims, 8 Drawing Sheets

(51) Int. Cl.
| | |
|---|---|
| *G02B 27/10* | (2006.01) |
| *H01S 5/40* | (2006.01) |
| *G02B 27/28* | (2006.01) |
| *G02B 27/30* | (2006.01) |
| *G02B 27/42* | (2006.01) |
| *H01S 3/00* | (2006.01) |
| *H01S 3/13* | (2006.01) |
| *H01S 3/23* | (2006.01) |
| *H01S 5/00* | (2006.01) |

(52) U.S. Cl.
CPC ........... *G02B 27/286* (2013.01); *G02B 27/30* (2013.01); *G02B 27/4244* (2013.01); *G02B 27/4277* (2013.01); *H01S 3/0071* (2013.01); *H01S 3/1305* (2013.01); *H01S 3/1307* (2013.01); *H01S 3/2391* (2013.01); *H01S 5/405* (2013.01); *H01S 5/4012* (2013.01); *H01S 5/4062* (2013.01); *H01S 5/4087* (2013.01); *H01S 5/005* (2013.01)

(58) Field of Classification Search
CPC .... G02B 27/106; G02B 27/286; G02B 27/30; G02B 27/4244; G02B 27/4277; G02B 27/0087; G02B 27/1013; G02B 27/1073; H01S 5/4012; H01S 5/005; H01S 5/4087
USPC .... 359/572, 341.4, 341.1, 639, 629, 489.19, 359/566, 568, 569, 570
See application file for complete search history.

(56) References Cited

U.S. PATENT DOCUMENTS

| | | |
|---|---|---|
| 6,192,062 B1 | 2/2001 | Sanchez-Rubio et al. |
| 6,208,679 B1 | 3/2001 | Sanchez-Rubio et al. |
| 6,327,292 B1 | 12/2001 | Sanchez-Rubio et al. |
| 8,049,966 B2 | 11/2011 | Chann et al. |
| 9,134,538 B1 * | 9/2015 | Augst ................. G02B 27/106 |
| 2005/0248819 A1 * | 11/2005 | Hymel ................. G02B 3/06 359/15 |
| 2011/0216417 A1 | 9/2011 | Chann et al. |
| 2011/0216792 A1 * | 9/2011 | Chann ................. G02B 27/0905 372/31 |
| 2011/0222574 A1 | 9/2011 | Chann et al. |
| 2011/0305250 A1 | 12/2011 | Chann et al. |
| 2011/0305256 A1 | 12/2011 | Chann et al. |
| 2011/0310921 A1 | 12/2011 | Chann et al. |
| 2012/0002272 A1 | 1/2012 | Chann et al. |
| 2012/0105968 A1 | 5/2012 | Chann et al. |

FOREIGN PATENT DOCUMENTS

| | | |
|---|---|---|
| DE | WO 2006/116477 A2 | 11/2006 |
| DE | 102008056128 A1 | 5/2010 |
| DE | 102011003142 A1 | 7/2012 |
| DE | 102011016253 A1 | 10/2012 |
| EP | 1601072 A1 | 11/2005 |
| EP | 1619765 A1 | 1/2006 |
| EP | 2088651 A1 | 8/2009 |
| EP | 2342597 B1 | 8/2012 |
| EP | 2523280 A2 | 11/2012 |
| WO | 2005119863 A1 | 12/2005 |
| WO | 2006116477 A2 | 11/2006 |

OTHER PUBLICATIONS

N. Lichtenstein, et al. "Singlemode Emitter Array Laser Bars for High-Brightness Applications", IEEE 19th International Semiconductor Laser Conference, 2004, Conference Digest, pp. 45-46.

B. Chann, et al. "High-Power Near-Diffraction-Limited Wavelength-Beam-Combined Diode Arrays", 2005 Conference on Lasers & Electro-Optics (CLEO), pp. 429-431.

Notification Concerning Transmittal of Translation of the International Preliminary Report on Patentability and Written Opinion of the International Searching Authority for corresponding PCT Application No. PCT/EP2014/054860, mailed Sep. 24, 2015, 17 pages.

* cited by examiner

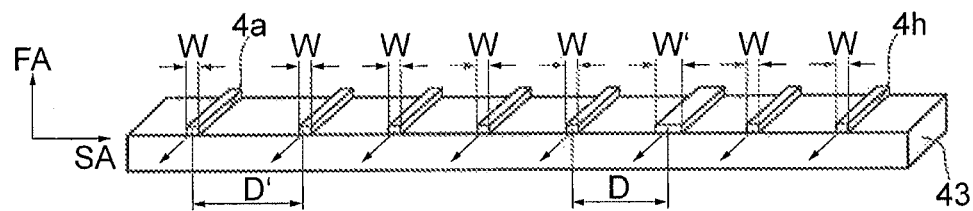
Fig. 17
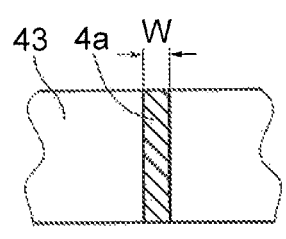 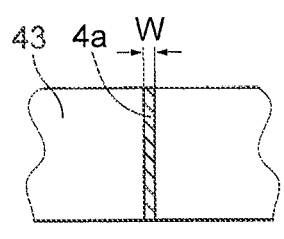 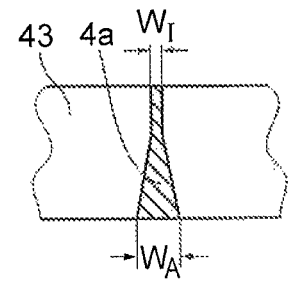
Fig. 18a    Fig. 18b    Fig. 18c
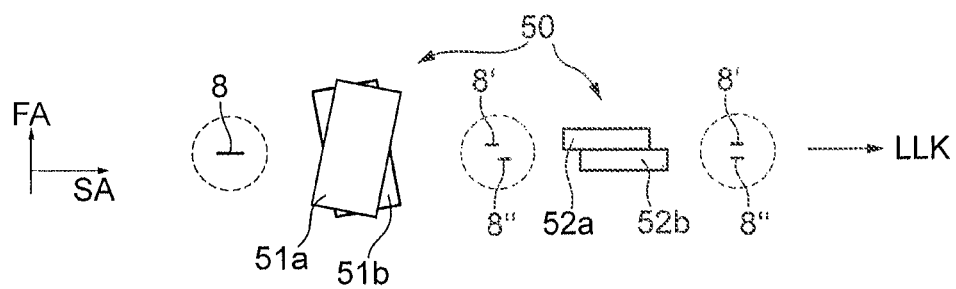
Fig. 19

DEVICE FOR WAVELENGTH COMBINING OF LASER BEAMS

BACKGROUND OF THE INVENTION

1. Field of the Invention

The present invention relates to a device for wavelength coupling of laser beams with different wavelengths, comprising: at least one laser source for generating a plurality of laser beams, and at least one overlapping device for the spatial overlapping of the plurality of laser beams to form an overlapped laser beam with a plurality of wavelengths.

2. Description of Related Art

A device for the (dense) wavelength coupling of a plurality of laser beams comprises a laser source that generates a plurality of laser beams for overlapping or wavelength coupling. The laser beams are spatially overlapped in an overlapping device and form an overlapped laser beam that has a plurality of wavelengths. Spectrally sensitive elements, for example in the form of edge filters, may be used as an overlapping device. An angle-dispersive optical element is frequently used as an overlapping device. The laser beams striking at different angles are overlapped on the angle-dispersive optical element, because of their different wavelengths, to form a single laser beam with a plurality of different wavelengths. A reflecting or transmitting grating, which reflects or transmits the laser beams striking at different angles of incidence at a common emergent angle is frequently used as an angle-dispersive element. The gratings may, for example, be designed as dielectric reflection or transmission gratings, volume Bragg gratings (VBGs), or as gratings based on a hologram (volume holographic gratings), as described, for example, in EP2523280 A2. An angle-dispersive optical element, for example in the form of a prism may also be used as an overlapping device.

There are various possibilities for realising the angular distribution or generation of laser beams striking the angle-dispersive optical element at different angles. U.S. Pat. No. 6,192,062 B1 discloses, for example, a device in which an imaging optical element in the form of a lens is used. The lens converts a spatial distribution in a first focal plane, in which is arranged a plurality of amplifier elements (laser emitters), to an angular distribution in a second focal plane. The typically parallel laser beams emerging from the amplifier elements at different points in the first focal plane strike the diffraction grating at different angles as a result of the place-to-angle transformation, as required. The lens used for the transformation may be designed as a cylindrical lens or, as the case may be, a spherical lens, and is also referred to in the following as a transformation lens.

As an alternative to using an imaging optical element for realising the angular distribution on the angle-dispersive optical element, it is also possible to alter the direction of radiation of the laser beams emerging from a plurality of laser sources spaced apart from each other so that they strike the angle-dispersive optical element at different angles in an overlap region. To achieve this a plurality of lenses may be used for receiving and focussing the laser beams from the plurality of laser sources, the pitch between the lenses differing from the pitch between the laser sources, as described in detail in WO 2006/116477 A2.

To generate laser beams with different wavelengths for the overlap, wavelength stabilisation is required. To realise the stabilisation a feedback may be provided for each laser beam to be overlapped to stabilise the respective wavelength of the laser emitter assigned to the laser beam. In this case so-called volume Bragg gratings or grating waveguide mirrors that reflect some of the laser radiation back into the respective laser emitter can be used as feedback elements. The wavelength stabilisation may also be achieved by means of a common feedback element, for example by means of a so-called chirped volume Bragg grating that enables a plurality of laser emitters to be stabilised on different wavelengths. It is also possible to effect the feedback directly in a respective laser emitter, for example when using a so-called "Distributed Feedback" (DFB) laser, where the feedback element, in the form of a grating structure, is written into the laser-active medium itself. The feedback element or grating structure can also be arranged outside the laser-active zone, but in a waveguide integrated on the same chip, as is the case, for example, with the so-called "distributed Bragg reflector" (DBR) laser. The spectral bandwidth of an individual wavelength-stabilised laser beam is generally between approx. 0.1 nm and 0.4 nm in this case.

The feedback may also be achieved by means of a feedback element that is arranged in the path of the overlapped laser beam. In this case a partially reflecting output coupling element is frequently used as the feedback element, where the entire device, as far as the output coupling element, is used as a resonator (so-called "external cavity laser"). In such a device a beam telescope, consisting of two cylindrical lenses or two spherical lenses, can be used as disclosed, for example, in U.S. Pat. No. 8,049,966 B2. An individual lens can also be arranged in the path of the overlapped laser beam approximately at the distance of its focal length, as disclosed for example, in U.S. Pat. No. 6,192,062 B1.

To generate the laser beams the laser source typically has a plurality of laser emitters that are designed as laser diodes. A number of strip type laser diodes, typically between approx. 5 and approx. 55 or 60, may in this case be arranged next to each other on a common chip, which is also referred to as a laser bar. A laser diode typically generates a laser beam that diverges comparatively quickly in a first direction (FA (fast axis) direction), i.e. has a large beam angle of approx. 40° or more, for example, and diverges comparatively slowly in a second direction (SA (slow axis) direction), and propagates at a beam angle of approx. 15° or less, for example. The laser beam emitted from a respective laser diode has an almost diffraction-limited beam quality in the FA direction and has a comparatively poor beam quality in the SA direction, at least for currently known broad stripe emitters. The SA direction typically runs in the plane of the bar transverse to the stripe type laser diodes, and the FA direction runs perpendicular to it. The laser diodes can be arranged on the bar at a constant pitch to each other, but it is also possible for the pitch to vary between adjacent laser diodes of the bar. The beam parameter product of the individual laser diodes or stripe emitters of a bar in the SA direction may vary, as disclosed in EP 2 088 651 of the applicant, for example. To generate a variation of the beam parameter product at least some of the stripe emitters may be designed with different widths in the SA direction.

To collimate the exiting laser beams a cylindrical lens can be arranged on the bar or some distance from it to collimate the laser beams of the individual laser diodes in the FA direction. A collimation of the individual laser beams of the bar may also be conducted in the SA direction by means of a microoptic cylindrical lens array.

A plurality of laser bars that are arranged next to each other in the SA direction form a so-called horizontal stack. The diode bars can in this case be arranged on a common heat sink, for example by so-called "direct copper bonding", DCB. If necessary cooling ducts can be installed in a DCB heat sink for water cooling of the diode bars. In this case the heat sink may be designed so that it is extremely thin, giving rise to a low pitch, i.e. a short distance between the individual laser emitters, since thermal crosstalk between the individual laser emitters is reduced by the low thermal resistance and the packing density can therefore be increased.

It goes without saying that the stacking of a plurality of laser bars one above the other (i.e. in the FA direction) is also possible, this being termed vertical stacking. Such a vertical stack may, in particular, be cooled on the back by a common DCB heat sink, allowing a high filling factor during stacking of the laser bars. A plurality of laser bars may also be arranged in an arc so that the emission directions are directed towards the inside of the arc, as disclosed in EP 1619765 A1, for example.

U.S. Pat. No. 8,049,966 B2 discloses a method of overlapping the laser radiation from a plurality of laser emitters or laser bars of a vertical stack arranged one above the other in the wavelength. In US 2011/0216417 A1 it is proposed to use a transformation device in the form of an optical rotator to rotate the laser beams of the diode bars or laser emitters of a horizontal stack by 90°, for example, thereby transposing the roles of the SA direction and FA direction before the laser beams are overlapped in the wavelength. In US 2011/0222574 A1 it is proposed to carry out a two-dimensional wavelength overlap of laser beams generated by a two-dimensional array of laser sources by means of two overlapping devices in the form of gratings.

In addition to the mechanical stacking described above, optical stacking of the laser beams generated by a plurality of laser emitters or laser bars is also possible. An interleaver is often used for this purpose. The interleaver may be used, for example, to interleave the laser beams of a vertical or horizontal stack of diode bars so that they lie one above the other after interleaving in one dimension or direction. The interleaving may for example, be achieved by the method disclosed in EP 1601072 A1. It is also possible to interleave the laser beams of two vertical stacks, for example, by means of slit mirrors as interleavers to reduce the filling factor or pitch between the laser beams generated by the individual diode bars and packing them optically tighter. It is also possible to displace, relative to each other, the laser beams of a horizontal stack of diode bars arranged next to each other in the SA direction by means of a first stack of plates or mirrors rotated into a fan shape in the FA direction and to generate a stack of laser beams in the FA direction by means of a further stack of plates or mirrors rotated against each other, which stack may be arranged rotated 90° to the first stack, for example, as disclosed in DE 10 2011 016 253 A1.

In addition to diode bars each of which have a plurality of laser emitters, so-called single emitters are also commonly used, i.e. laser diodes where only one single emitter is arranged on a chip or bar. The collimation lenses in such a single emitter in the FA and SA directions are often also arranged on the heat sink of the chip or adjacent to it. A stack can also be formed from single emitters. In conventional stacks a plurality of single emitters can be arranged adjacent to each other on different stages of a stepped base body (heat sink). The parallel running laser beams generated by the single emitters may, for example, be arranged above each other, e.g. via a mirror device in one dimension or direction in space.

In the wavelength overlapping of laser beams generated by a plurality of laser bars a comparatively high laser power can be achieved. In such an overlap the emitters or laser diodes of a laser bar may have the same wavelength. For example, U.S. Pat. No. 8,049,966 B2 discloses a method of stacking a plurality of horizontal stacks of laser bars one above the other and overlapping the laser beams generated by bars arranged one above the other in the wavelength. However, the beam quality in such an overlap is normally inferior to that when the laser beams of a plurality of single emitters are overlapped, each of which has a different wavelength. Such an overlap of the laser beams generated by a plurality of laser emitters arranged on a common bar may be achieved, for example, by arranging for the alignment of the laser beams to be rotated by means of a transformation device before the overlap, as disclosed, for example, in US 2011/0216417 A1. Although in this case a high beam quality can be achieved after the overlap, the total power that can be achieved for an individual external resonator in a wavelength overlap of the laser beams of a plurality of single emitters is poorer, comparatively speaking.

In both cases the laser beam generated in the overlap can be supplied to a beam guide system for further use. The overlapped laser beam is frequently coupled into an optical fibre. Power scaling is possible before coupling by means of spatial multiplexing or polarisation multiplexing. Further coarse spectral coupling may also be carried out by means of dielectric edge filters, as described in detail in U.S. Pat. No. 8,049,966 B2 for example. To ensure efficient coupling of the overlapped laser beam into the optical fibre the beam profile of the overlapped laser beam should be adapted to the cross-section of the optical fibre. The adaptation of the beam profile may be performed by means of suitable beam telescopes, for example. Typically symmetrisation of the beam quality, which generally differs in two directions perpendicular to each other after overlapping, is also required. For this purpose a beam transformation of the overlapped laser beam can be carried out to generate an essentially symmetrical laser beam for the coupling. For adaptation of the beam profile, i.e. the distribution of intensity of the laser beam transverse to the direction of propagation, multiplexing by spatial juxtaposition of a plurality of overlapped laser beams outcoupled from a plurality of external resonators, for example, is also possible, cf. for example EP 2 088 651 A1. Adaptation of the beam profile or beam quality by polarisation coupling can also be carried out.

The overlapped laser beam or beams may be coupled into a beam guide, for example in the form of an optical fibre, and can be used for pumping a laser, for example a solid state laser. A laser beam generated by the solid state laser or the laser beam generated by the wavelength coupling device can itself be used for the treatment of materials, particularly for laser cutting, laser welding, laser drilling, hardening, re-melting, powder application, etc.

SUMMARY OF THE INVENTION

An object of the present invention is to provide a device for wavelength coupling with improved properties. This object is achieved according to a first embodiment by a device for wavelength coupling of the type mentioned in the introduction, further comprising: a feedback device arranged in the beam path between the laser source and the overlapping device for feedback of a proportion of the radiation of the laser beams to be overlapped back to the laser source, the feedback device comprising or being configured as a partially reflecting angle-dispersive optical element, in particular a partially reflecting diffraction grating.

In this embodiment, a wavelength stabilisation of the laser emitters used to generate the laser beams is not carried out as is normally the case, by means of a feedback device in the form of a output coupling mirror, but by a feedback device arranged between the laser source and the overlapping device in the form of a partially reflecting angle-dispersive optical element, for example in the form of a partially reflecting diffraction grating that enables all the laser emitters used for the overlapping to be stabilised at once in the wavelength.

For the wavelength stabilisation the partially reflecting angle-dispersive optical element can reflect a proportion of the incident radiation intensity of approx. 10%, and can transmit approx. 90%, for example. It is obvious that the ratio of transmitted to reflected laser radiation is not limited to the above example of proportions but rather a larger or smaller proportion of the incident radiation intensity can be reflected back to the laser source, depending for example on the type of laser emitters used (e.g. VCSEL).

In a further development of this embodiment, the device has at least one imaging optical element arranged between the laser source and the angle-dispersive optical element for the spatial overlapping of the laser beams of the laser source on the angle-dispersive optical element. The imaging optical element may, for example, be a lens which is arranged at approximately the distance of the focal length from the laser source, more precisely from the light-emitting surfaces of the laser emitters of the light source typically arranged in a common plane. The partially reflecting angle-dispersive optical element is in this case generally also arranged approximately at the distance of the focal length of the lens. The laser beams of the light source to be overlapped are typically already collimated in at least one, generally two directions (SA direction and FA direction).

As already described the spatial distribution in the plane of the laser emitters can in this way be converted to an angular distribution in the region of the angle-dispersive optical element. However, the use of an imaging optical element represents only one of a plurality of possibilities of generating a spatial overlap of the laser beams generated by a plurality of laser emitters in the region of the angle-dispersive optical element. Further possibilities of converting the spatial distribution in the plane of the light-emitting surfaces of the laser emitters to an angular distribution on an angle-dispersive overlapping device are described in detail below. These possibilities may also be used to generate a spatial overlap on the angle-dispersive optical element used as the feedback device, for example in the form of a partially reflecting diffraction grating.

In a further development the partially reflecting diffraction grating is arranged at the so-called Littrow angle relative to the striking laser beams. In such an arrangement the angle of incidence of the striking laser radiation corresponds to the angle of reflection of the reflected (or on the grating diffracted) proportion of the radiation.

The Littrow condition states:

$$\sin(\alpha_L) = m_1 \lambda / (2 g_1) \quad (1)$$

where $\alpha_L$ denotes the Littrow angle, $m_1$ the diffraction order, $\lambda$ the wavelength of the laser radiation and $g_1$ the grating constant of the diffraction grating. Because of the place-to-angle transformation the laser beams emitted by different laser emitters strike the diffraction grating at different angles. The feedback and hence the wavelength stabilisation and oscillation of a laser emitter takes place at the (discrete) wavelength, which is assigned to the respective (discrete) angle of incidence of the associated laser beam to be overlapped on the diffraction grating. The $-1^{st}$ diffraction order is typically used as the reflected (or diffracted) diffraction order. In the case of the $-1^{st}$ diffraction order the incident and reflected laser beam lie on the same side related to the normal direction or the perpendicular, respectively. The proportion of the radiation that is not diffracted is generally transmitted by the diffraction grating without deflection and with a small lateral displacement.

The overlapping of the laser beams transmitted by the angle-dispersive optical element of the feedback device can be carried out by means of an angle-dispersive optical element of the overlapping device, for example by means of a prism or by means of a diffractive grating. Due to an adjustment of the properties of the two angle-dispersive optical elements relative to each other, it can be ensured that the overlapped laser beam runs essentially in the same direction and that the overlapped laser beam leaves the overlapping device essentially at the same angle. In this case the phrase "essentially the same" means that the divergence of the overlapped laser beam is greater than the divergence of a laser beam to be overlapped individually by no more than a factor of 10, preferably a factor of 5, and in particular a factor of 2.

In an advantageous development the overlapping device has a diffraction grating. The diffractive grating can be transmitting or reflecting. The diffraction grating of the overlapping device can be arranged in the immediate vicinity of the angle-dispersive optical element of the feedback device. In this case the diffraction grating is generally designed transmissively. The diffraction grating may also be designed reflectively, particularly in the case where the diffraction grating is arranged at a greater distance from the angle-dispersive optical element of the feedback device.

When the properties of the diffraction grating of the overlapping device are suitably matched to the partially reflecting diffraction grating of the feedback device, spatial overlapping of the laser beams to form an overlapped laser beam can be achieved in a surprisingly easy way.

In this case a grating constant $g_1$ of the partially reflecting diffraction grating of the feedback device and a grating constant $g_2$ of the diffraction grating of the overlapping device are matched to each other so that the overlapped laser beam leaves the diffraction grating of the overlapping device at essentially the same emergent angle. The laser beams striking at different angles of incidence will be combined on the diffraction grating serving as the overlapping device to form a common laser beam, which ideally escapes from the diffraction grating at a single emergent angle, i.e. is reflected or transmitted by it.

The grating planes of the partially transmitting diffraction grating of the feedback device and of the diffraction grating of the overlapping device may be aligned parallel with each other. In this case the condition that must be met when using a partially reflecting first diffraction grating to generate a constant angle of reflection on the second diffraction grating is typically independent of the wavelength of the laser beams to be overlapped for an emergent angle of 0°. In this case it is ensured, by selecting such an emergent angle, that the laser beams transmitted by the partially reflecting diffraction grating are overlapped dispersion-free.

In an embodiment of the invention the following condition applies to the grating constant $g_2$ of the diffraction grating of the overlapping device and the grating constant $g_1$ of the partially reflecting diffraction grating of the feedback device: $m_2/g_2 = m_1/(2 g_1)$, $m_1$ denoting the diffraction order of the partially reflecting diffraction grating of the feedback device and $m_2$ denoting the diffraction order of the diffraction grating of the overlapping device. In this case the distance between adjacent grating structures of the diffraction grating typically designed as a blaze grating or a binary grating is understood to be the grating constant. It is advantageous for the two diffraction orders of the diffraction grating to correspond, i.e. when: $m_1 = m_2$.

The above condition may be derived from the general relation between the angle of incidence $\alpha$ and emergent angle $\beta$ in the diffraction on a grating with the respective refractive indices $n_1$ and $n_2$ in a diffraction order $m_2$, which is expressed as follows:

$$\sin(\alpha)n_1 + \sin(\beta)n_2 = m_2 \lambda / g_2. \quad (2)$$

In the case of a reflecting diffraction grating with air as the optically thinner medium the following condition applies: $n_1 = n_2 = 1.0$. This gives rise to equation (1), provided that the angle of incidence $\alpha$ and emergent angle $\beta$ have the same value (for diffraction order $m_1$ and grating constant $g_1$). In this case the angle of incidence $\alpha$ on the second grating corresponds to the Littrow angle $\alpha_L$. By substituting equation (1) in equation (2) the condition indicated above between grating constants $g_1$ and $g_2$ at an emergent angle $\beta$ of 0° and with air as the optically thinner medium (i.e. $n_1 = 1.0$) follows.

If the grating planes of the two diffraction gratings are not arranged in parallel but an angle to each other, there is typically no analytical solution that satisfies the (correspondingly modified) equations (1) and (2). In this case an (approximate) solution of the corresponding equations can be obtained that meets the condition that the different wavelength proportions are overlapped and escape from the diffraction grating of the overlapping device at essentially the same angle, particularly in cases where the wavelength used is much smaller than the grating constant or distance between the grating lines.

In a further embodiment the partially reflecting diffraction grating of the feedback device and the diffraction grating of the overlapping device are configured as a common optical element. In this case the partially reflecting diffraction grating is typically formed on a first side of a transmitting base body, whilst the generally transmitting diffraction grating is formed on an opposite side of the base body. As described above, the grating planes and the two sides of the base body on which the two diffraction gratings are formed may be aligned parallel with each other. Since the base body is formed from a material with a higher refractive index than the surrounding area, a refraction takes place and hence a change in the angle of the laser beams to be overlapped and striking the partially reflecting diffraction grating, so that these beams strike the transmissive diffraction grating formed on the opposite side of the base body at a different angle.

The following applies:

$$\sin(\alpha)(n_1/n_2)n_2 + \sin(\beta)n_2 = m_2 \lambda / g_2 \quad (2)$$

where $n_2$ and $n_1$ denote the refractive index in the optically denser medium (in the base body) and in the optically thinner medium (of the surrounding area), respectively. Substituting equation (1) in equation (2) provides a correspondingly modified condition for the grating constants $g_1$, $g_2$, which enables the properties of the diffraction gratings to be matched to each other so that the overlapped laser beam leaves the transmitting diffraction grating at an essentially identical angle of reflection (of 0°). In the typically occurring case that the optically thinner medium is air, which has a refractive index of approximately $n_1 = 1.0$, the relation derived here for the grating constants $g_1$, $g_2$ corresponds to the relation derived above, i.e.: $m_2/g_2 = m_1/(2 g_1)$.

In another embodiment a beam telescope is arranged between the partially reflecting diffraction grating of the feedback device and the diffraction grating of the overlapping device. The beam telescope enables the two diffraction gratings otherwise typically arranged adjacent to each other to be arranged at a comparatively long distance from each other. The dimensions of the intensity distribution (and of the beam cross-section) of the laser beams to be overlapped can obviously also be changed by the beam telescope. The beam telescope may comprise transmissive optical elements, e.g. lenses, and/or reflecting optical elements, e.g. mirrors. The use of a single optical element as a beam telescope is also possible. The diffraction grating of the overlapping device may be designed as a reflecting grating, particularly when the beam telescope is used, since in this case the construction space is sufficiently large to prevent the reflected overlapped laser beam to strike the partially reflecting diffraction grating.

If a beam telescope with an imaging ratio A is inserted between the two diffraction gratings, it is also necessary to modify the condition indicated above between the grating constants. For a dispersion-free overlap of the laser beams on the diffraction grating of the overlapping device the following applies:

$A m_2/g_2 = m_1 (2 g_1)$, where, as described above, $m_1$ denotes the diffraction order of the partially reflecting diffraction grating of the feedback device, $m_2$ denotes the diffraction order of the diffraction grating of the overlapping device and A denotes the imaging ratio of the beam telescope. The selection of identical diffraction orders ($m_1 = m_2$) is also advantageous in this case, and particularly preferable is the case with $|m_1| = |m_2| = 1$.

A second embodiment of the present invention relates to a device of the type mentioned in the introduction, further comprising: a feedback device for feeding a proportion of the radiation of the overlapped laser beam back to the laser source and a phase correction device for the phase correction of the proportion of radiation reflected back to the laser source. As explained above, the feedback device is used for the wavelength stabilisation of laser emitters of the light source so that they generate laser beams each with different wavelengths. For the feedback the problem arises that the laser radiation reflected back to the light source must strike the relevant emitter precisely because otherwise the wavelength stabilisation is greatly impaired and the bandwidth of the emitted laser beams is considerably increased or the spectral capture range reduced and the laser emitter emits within an undesirable spectral range.

To improve the coupling of the proportion of radiation reflected back to the light source, it is proposed, in the present embodiment of the invention, to carry out a phase correction of the wave front of the overlapped laser beam so that the proportion of radiation reflected back can be coupled as precisely as possible into the laser emitters of the laser source. To achieve this the feedback element, in particular, more accurately the reflecting surface of the feedback element, can be adapted to the curvature of the phase front of the overlapped laser beam of the beam bundle. Compared with the length of the path of the overlapped laser beam between the overlapping device and the feedback device, which is typically within the range between approx. 2 cm and approx. 20 cm, the radius of curvature of the phase front is typically more than one order of magnitude higher, i.e. this radius is approx. 2 m or higher. The phase correction device may also have a phase correction plate that allows individually adjustable phase correction at any point on the beam cross-section of the overlapped laser beam.

In an embodiment the overlapping device is designed as a diffraction grating that is rotatably mounted about a rotary axis to vary the wavelengths of the laser beams to be overlapped. By rotating the diffraction grating about a rotary axis that typically runs perpendicular to the overlapping direction, the wavelengths of the laser beams to be overlapped can be tuned and suitably displaced amazingly easily. If necessary the diffraction gratings can be rotated about the axis of rotation by means of an actuator. However, it is generally sufficient for the diffraction grating to be delivered or fixed manually in different angular positions relative to the laser beams to be overlapped by means of a suitably designed bearing or suitable bracket.

In an embodiment a polarisation filter is arranged in the beam path between the laser source and the feedback device, preferably in the beam path between the overlapping device and the feedback device. The polarisation filter is used to filter undesirable proportions of radiation, particularly undesirable TM modes that are generated by the laser source and whose feedback into the laser source should be prevented. In this case it is advantageous for the laser radiation emitted by an appropriate laser emitter to have a proportion of radiation (or proportion of intensity) that is typically more than approx. 95% with a linear polarisation in a main polarisation direction, and for a proportion of radiation of approx. 5% not to be polarised in the main polarisation direction. The proportion of the laser radiation that is polarised in the main polarisation direction has a higher beam quality than the proportion of radiation not polarised in the main polarisation direction in the sense that edge fields (high SA angle proportions) are less pronounced. Due to the provision of a polarisation filter, which filters out the undesirable proportions of radiation not polarised in the main polarisation direction, the beam quality of the proportion of radiation reflected back to the laser source can therefore be improved. The arrangement of the polarisation filter between the overlapping device and the feedback device has proved favourable because the overlapped laser beam is typically collimated there, which favours the polarisation filtering.

In a further development of this embodiment the polarisation filter and the overlapping device or the polarisation filter and the feedback device are configured as a common optical element. The polarisation filter may, for example, be realised by the provision of a suitable dielectric coating on the feedback device and the overlapping device, respectively. It is obvious that the combination of polarisation filter and feedback or overlapping device can be carried out by means other than by a dielectric coating.

A phase correction element of the phase correction device and the feedback device are preferably configured as a common optical element. The common optical element may, in particular, have a spherical or cylindrical curvature, which is adapted to the (mean) curvature of the wave front of the overlapped laser beam. In addition deviations from the mean curvature of the wave front that vary across the beam cross-section, location-dependently, can be corrected with a further phase correction element, for example by means of the above-mentioned phase correction plate.

In a further embodiment the feedback device is designed as an output coupling element with a surface partially reflecting the overlapped laser beam. As explained above, the output coupling element, together with the laser source or with the emitters, forms an (external) resonator. As is normal in conventional external resonators, the output coupling element reflects a first radiation proportion and transmits a second radiation proportion that can, for example, be coupled into an optical fibre. In conventional external resonators the partially reflecting surface of the output coupling element is designed flat and may, for example, by formed by a partially reflecting light ingress surface of the optical fibre.

In a further development of the embodiment the partially reflecting surface of the output coupling element has a (generally concave) curvature and preferably has a cylindrical or spherical shape. The curvature of the partially reflecting surface is typically adapted to the generally cylindrical or spherical curvature of the phase front of the overlapped laser beam. In the cylindrical design of the partially reflecting surface the feedback may be optimised in the FA or SA direction.

For the separate minimisation of the feedback losses in the SA and FA directions it is necessary to use a different reactive power in the SA and FA directions. When the partially reflecting surface is spherical in shape the feedback can also be optimised both in the SA and in the FA direction if a further imaging optical element or a group of elements (e.g. a beam telescope) is provided. If necessary the reflecting surface may also have two different radii of curvature (cross cylindrical lens or astigmatic lens). It is obvious that in a device in which a plurality of overlapped laser beams are generated a common output coupling element can be used for the overlapped laser beams on which are provided a plurality of partially reflecting surfaces arranged next to each other and are adapted to the phase curvature (e.g. in the manner of a raster line or array).

In a further embodiment the output coupling element is configured for beam shaping of the outcoupled or transmitted overlapped laser beam, i.e. the output coupling element has a diffractive power for the outcoupled overlapped laser beam. For example an output-side surface of the output coupling element can have a curvature and can, in particular, be designed as a meniscus lens. In this case the (generally concave) lens surface of the meniscus lens forms the partially reflecting surface, which can be achieved, for example, by providing a suitable reflecting coating on the lens surface. The generally convex lens surface facing away from the external resonator is used to collimate the proportion of radiation outcoupled from the device or the external resonator, and ensure that the divergence properties of the outcoupled proportion of radiation is not or only slightly influenced by the curvature of the partially reflecting surface.

In a further development the phase correction device has an imaging optical element in which the radius of curvature of the imaging optical element is adapted to the radius of the phase curvature of the overlapped laser beam and which is designed to collimate the overlapped laser beam to the (flat) partially reflecting surface of the output coupling element. The collimating optical element may, for example, be designed as a collimation lens whose radius of curvature is adapted to the phase front of the striking overlapped laser beam to optimise the feedback. In this embodiment the output coupling element may have a partially reflecting surface with flat geometry, but is also possible for the partially reflecting surface to have a curvature in addition to this. The radius of curvature and hence the focal length of the imaging optical element is much larger (typically at least one order of magnitude larger) than the length of the beam bath between the overlapping device and the output coupling element. In the case of a beam path of between approx. 2 cm and 20 cm between the overlapping element and the output coupling element, for example, the focal length of the imaging optical element is generally approx. 2 m or more.

In a further embodiment the overlapping device and the feedback device, particularly the output coupling element, are configured as a common optical element. The common optical element may be formed from a transmissive base body for the laser radiation on whose front side an overlapping device in the form of a grating is arranged, and on whose second opposing front side is provided a partially reflecting coating that may, in particular, have a (convex) curvature. The common optical element and the base body may be designed, for example, in the manner of a wedge-shaped prism.

In one embodiment a first imaging optical element arranged in the beam path between the laser source and the overlapping device, together with a second imaging optical element arranged between the laser source and the overlapping device forms a beam telescope. The beam telescope may be used to increase the efficiency of the feedback of the proportion of radiation reflected back to the laser source. In particular, if the laser beams are overlapped in the FA direction, e.g. with a cylindrical lens, a beam telescope acting in the SA direction has proved favourable.

The beam telescope may, for example, be used to realise a 4f imaging between the light-emitting plane of the laser source in a focal plane of the first imaging optical element and a feedback device in a focal plane of the second imaging optical element. It is evident that a single optical element can also be used instead of a beam telescope to increase the efficiency of the feedback. In this case the light-emitting plane of the laser source may, for example, be arranged in its first focal plane and the feedback device can be arranged in its second focal plane.

In a further embodiment an imaging optical element arranged in the beam path between the laser source and the overlapping device forms a beam telescope together with an imaging optical element arranged in the path of the overlapped laser beam. The beam telescope can be used to adapt the beam cross-section, e.g. for coupling into an optical fibre.

In a further embodiment the device has a beam deflection device for aligning the laser beams onto a common overlapping area of the overlapping device or feedback device. In this case the laser beams can be aligned to the common overlapping area of the overlapping device, as described in WO 2006/116477 A2 already mentioned, by selecting a varying difference between the laser beams or laser emitters and the associated collimation lenses, which overlapping device is in this case designed as an angle-dispersive optical element.

In a further development of this embodiment the beam deflection device has a facet element with a plurality of facts for aligning a respective laser beam to the common overlapping area. A transmissive facet element may be used for the deflection, where a facet is assigned to each laser beam to be overlapped for the alignment. In this case the facet element typically has a plate-type base body with generally wedge-shaped partial areas that form the facets. The fact element may also be designed as a reflecting optical element whose mirror facts are aligned relative to the laser beams so that they are deflected to the common overlapping area or aligned to it. To optimise the filling factor a double facet element or two facet elements matched to each other may be used, two of the facets cooperating, for example, in the manner of an anamorphotic prism pair.

In a further embodiment the beam deflection device has a plurality of deflection mirrors for aligning the laser beams to the common overlapping area of the overlapping device. In this case the laser beams already supplied for overlapping by a plurality of laser emitters or by a plurality of bars are aligned to the common overlapping area by the defection mirrors. It is advantageous for the beam paths between the light-emitting surfaces of the individual emitters or bars and the common overlapping area to be of the same size. The condition for the same optical beam paths to the overlapping area may typically be met if the position of the deflection mirrors and the angles of deflection of the deflection mirrors are suitably chosen. Depending on the quality of the collimation of the laser beams, the requirement of the same beam paths may possibly be dispensed with.

In a further embodiment the device comprises a transformation device for rearranging the laser beams of the laser source and/or for rotating the orientation of the laser beams of the laser source. As described above, the laser beams generated by the laser source or by the individual laser emitters of the laser source in the FA direction and SA direction respectively have a different beam divergence. It may prove favourable, particularly for overlapping the laser beams of a plurality of laser emitters that are arranged on a common bar or on a plurality of bars of a horizontal stack, for the orientation of the laser beams to be rotated so that they are not overlapped in the SA direction but in the FA direction. The transformation device may, in particular, be designed as an optical rotator, for example as described in US 2011/0216417 A1, i.e. using two or more cylindrical lenses, a prism or by means of two mirrors rotated 90° in orientation. By altering the orientation of the laser beams a reduction in feedback efficiency caused by a deflection of a horizontal stack or bar can be avoided.

The transformation device may also cause a rearrangement of the laser beams generated by the laser emitters without a rotation in orientation. As explained above the laser beams of a horizontal stack of diode bars, which are arranged in the SA direction adjacent to each other, may generate a rearrangement of the laser beams, e.g. by means of two stacks of plates or mirrors rotated against each other, so that the beams are arranged one above the other after the transformation without altering the orientation in the FA direction.

In a further embodiment a collimation lens for collimating a plurality of laser beams running in a common plane and emitted by the laser source is oriented at an angle to the common plane, and the collimation lens, together with the transformation device designed to rotate the orientation of the laser beams, gives rise to an alignment of the laser beams to a common overlapping area. When a transformation device is used that rotates the orientation of the laser beams, an FA collimation lens typically arranged in the beam path before the transformation device can be used to radiate the laser beams to the transformation device at angles other than usual so that after passing through the transformation device they run convergently and are aligned to a common overlapping area of the overlapping device. To effect the overlap the collimation lens can be tilted at a comparatively small angle, e.g. approx. 0.5° or 0.1° to the common plane in which the laser emitters generating the laser beams are typically arranged. The laser emitters may, in particular, be arranged on a common laser bar.

A further possibility of overlapping the laser beams by means of a plurality of FA collimation lenses arranged one above the other in the FA direction consists in displacing the FA collimation lenses in the FA direction slightly in relation to their usual position. This has a similar effect to the use of different distances between the laser emitters and the collimation lenses, as described in WO 2006/116477 A2 cited above.

In a further embodiment at least one laser source has at least one optical module with a plurality of laser emitters for generating a beam exit profile with laser beams arranged adjacent to each other in one direction. The generation of a beam profile in which a plurality of laser beams to be overlapped are arranged adjacent to each other in one direction favours wavelength overlapping by means of a dispersive optical element. In the simplest case the optical module may have a bar on which the laser emitters are arranged adjacent to each other in the SA direction (mechanical stacking) to generate the desired beam exit profile. If in this case a transformation device is integrated in the optical module in the form of an optical rotator, the alignment of the individual laser beams can be rotated in the beam exit profile so that the laser beams can be overlapped in the FA direction.

In a further development the plurality of laser emitters of the optical module are arranged in a first direction and in a second direction perpendicular to the first so that they are offset relative to each other. This displacement can be achieved, for example, by arranging the laser emitters on different stages of a stepped supporting structure, e.g. a stepped heat sink. The optical Module also has a beam deflection device for generating the beam exit profile with the plurality of laser beams arranged adjacent to each other in one direction. As explained above, the laser emitters (single emitters) can be arranged on different stages of one or more stepped heat sinks, in which case a separate collimation lens is generally assigned in the SA direction and in the FA direction to each single emitter. For example, the beam deflection device may have a plurality of deflection mirrors, which, if necessary, are tilted in their relative position to each other so that they can be used for aligning the laser beams of the optical module to a common overlapping area, as described above.

In a further development at least two optical modules, particularly in the form of stepped supporting structures, e.g. stepped heat sinks, are stacked one on top of the other. In such a vertical stack formation the underside of the next heat sink can be connected directly to the top step stage of a heat sink. However, it is also possible to fasten two or more of the heat sinks to a common support so that the heat sinks stacked one on top of the other can be arranged spaced a certain distance from each other.

In a further embodiment at least two of the optical modules, e.g. in the form of stepped heat sinks, are arranged on a common arc of a circle. The arrangement of the heat sinks on a common arc simplifies the alignment of the beam bundles of the laser beams of the respective heat sinks to a common overlapping area on the overlapping device. It is evident that the arrangement of a plurality laser bars on a circular arc is also possible to simplify the overlapping of the laser beams generated by them or to align the laser beams generated by them to the common overlapping area.

In a further development the device is provided with an optical device for increasing the filling factor of the laser beams generated by two or more different optical modules. The optical device may be configured in several different ways.

For example, the optical device may have at least one slit mirror. This is particularly favourable if the laser beams generated by two or more vertical stacks of optical modules, particularly optical modules with stepped heat sinks, are to be interleaved. For the interleaving of laser beams that are generated by two vertical stacks of stepped heat sinks it is advantageous for the laser beams or laser beam bundles generated by a respective stack to have a filling factor of approximately 50% so that the interleaving can take place in such a manner that the gaps that are generated by the laser beams of one stack are filled by the laser beams of the other stack. The interleaving can also take place by means of optical elements stacked one on top of the other in the form of plate-type single mirrors, each of which are arranged rotated against adjacent single mirrors at a (generally constant) angle, as described, for example, in EP 2 342 597 B1.

To increase the filling factor the optical device may have at least one deflection device, particularly in the form of a prism arrangement. In addition to increasing the filling factor it is also possible to use the deflection device(s) to align the laser beams or beam bundles of a plurality of optical modules to a common overlapping area of the overlapping device or feedback device.

In a further embodiment at least one laser bar has exactly two laser emitters. In this so-called dual emitter two stripe emitters are each structured on a common laser bar spaced a certain distance apart in the SA direction (i.e. with a spatial separation). The laser beams generated by the two emitters may be collimated separately by means of one common FA collimation lens and two SA collimation lenses in the SA direction. The distance between the laser emitters in the SA direction may in this case be between approx. 500 µm and approx. 2 mm, for example. After the wavelength coupling of the first and second laser emitter of a plurality of bars of a vertical stack an overlapping e.g. by polarization coupling of laser beams of the first and second laser emitters respectively, overlapped in the wavelength, may be carried out. Alternatively both emitters of the laser bar can be collimated by means of a common SA collimation lens in the SA direction. In this case the distance between the two emitters is typically between approx. 0.1 mm and 1.0 mm.

In an embodiment at least one laser source has a plurality of laser emitters that are arranged on a common laser bar. The use of the transformation device described above for rotating the orientation of the laser beams has proved particularly advantageous in connection with laser bars because in this case an overlap of the single emitters, or in the case of a horizontal stack an overlapping of the laser beams of the single emitters of all the bars, can be carried out in the FA direction, thus ensuring—at least theoretically—that the beam quality of a single emitter can be achieved. The laser emitters can be arranged at constant distances from each other on the laser bar, but it also possible to vary the distances to avoid or at least reduce a crosstalk between the laser emitters.

In a further development the laser bar has a filling factor of over 20%, preferably over 25%, and in particular of over 30%. The high filling factor can be achieved by installing a larger number of laser emitters, e.g. with a comparably small emitter width, on the laser bar than is the case with conventional laser bars. In this case the filling factor defines, as is the rule, the width of a laser emitter related to the distance between two adjacent laser emitters. If the emitter widths of the laser emitters of the laser bar and the distances between the lasers vary, the minimum filling factor is used for calculating the filling factor, i.e. the laser emitter with the smallest quotient of the emitter width and distance to the nearest neighbour defines the filling factor.

The use of so-called "slab-coupled optical waveguide laser (SCOWL" diode arrays is known from the article "High-Power Near-Diffraction-Limited Wavelength-Beam-Combined Diode Arrays", by B. Chann et al., 2005 Conference on Lasers & Electro-Optics. These arrays achieve a beam quality factor of less than $M^2 < 1.35$. However, this so-called SCOWL diode array is operated with an SA collimation lens so that only a small filling factor and correspondingly only a lower power per bar can be achieved.

In a further development, deviating from the previous examples, a coupling of the laser beams in the SA direction takes place. In this case the laser emitters (or strip emitters) of the laser bar have a width of 10 μm or less, preferably of 5 μm or less. Laser emitters with such a small lateral extension are typically so-called single-mode emitters whose spectral bandwidth can be stabilised, at least theoretically, to an extremely narrow line width in the picometer range due to the beam parameter product resulting from the small width. In principle laser bars with such laser emitters are known, e.g. from the article "Singlemode Emitter Array Laser Bars for High-Brightness Applications" by N. Lichtenstein et al., IEEE 19$^{th}$ International Semiconductor Laser Conference, 2004, Conference Digest, pp. 45-46. Such laser bars were previously typically used in conjunction with an SA collimation lens array in odder to drive the optical filling factor as high as possible. The filling factor per bar, however, is limited to approx. 3% to 5% because of a minimum distance between the array lenses of approx. 200 μm that must be maintained and which limits the achievable power of each bar correspondingly. To achieve the high filling factor indicated above, providing individual SA collimation lenses is dispensed with. This can be achieved, for example, by using a beam telescope acting in the SA direction and an SA transformation lens or by using an SA transformation lens only to focus the laser radiation on the dispersive element and increase the feedback efficiency.

Because of the spectral stabilisation to a very small line width, the number of laser emitters per laser bar that can be coupled by a wavelength overlap in the SA direction increases so that despite the drop in power per laser emitter a high output power per wavelength band can be obtained. Another positive effect resulting from the reduction in the emitting area per emitter is the improvement in beam quality (see above). When SEAL bars are used the spectral bandwidth can be considerably reduced compared to conventional broad stripe emitters, which generally have a bandwidth from approx. 0.3 nm to 0.4 nm, for example to approx. 0.1 nm or less.

In a further development the individual laser emitters of the laser bar have a beam quality factor $M^2$ in the SA direction of less than 2.0, preferably of less than 1.5, in particular of less than 1.3. Laser emitters with such a diffraction index in the SA direction are single-mode emitters in which the number of possible laser modes in the SA direction is strictly limited so that they can be spectrally stabilised to an extremely narrow line width, which has a significant effect on spectral brilliance. In the case of a single-mode emitter it may be advantageous for the emitter length to be comparatively long (e.g. 4 mm or more), since the effect of the spatial hole burning gives rise to a spectral broadening that is inversely proportional to the emitter length.

In addition to the single-mode emitters with a constant stripe width described above, the values indicated above for the beam quality factor and beam parameter product may also be generated with a so-called trapezoid laser in which both a narrow strip of constant width, forming a monomode seed area, together with an amplifier area, trapezoidally expanding in the direction to a beam emitting surface, are arranged on a semiconductor chip. An emitter with a beam parameter product or a beam quality factor in the value range indicated above may, as the case may be, also be designed in the form of a so-called Z-laser or surface emitter (e.g. VCSEL, VECSEL).

In a further embodiment the device also comprises a beam forming device to form a beam profile of at least one overlapped laser beam. The forming of the beam profile is, in particular, favourable or required to increase the efficiency of the coupling of the laser radiation generated by the device into an optical fibre. Because of the typically round cross-section of the optical fibres, a generally symmetrical beam quality is advantageous for this purpose, i.e. a beam parameter product that has an aspect ratio of approx. 1:1 in a plane perpendicular to the direction of propagation.

To symmetrise the beam quality and adapt it to the aspect ratio or cross-section of the optical fibres, the beam forming device preferably has a device for the spatial rearrangement, with or without beam rotation, and/or for overlapping a plurality of overlapped laser beams and/or the at least two partial beams. The device may be used to rearrange spatially a plurality of overlapped laser beams generated by the overlapping device and/or a plurality of partial beams generated by the beam splitter device, which beams are arranged at different locations of the beam cross-section. The spatial rearrangement may be achieved in different ways. For example, stepped mirrors may be used for this purpose, thus enabling a rearrangement to be achieved without beam rotation. A beam forming device that rotates the laser beams for rearrangement may, for example, have a periscope arrangement.

In an embodiment the beam forming device has a beam splitter device to cut one of the overlapped laser beams into at least two partial beams. The beam splitter device may, for example, be a perforated or edge mirror that reflects or scrapes an outer area of the beam cross-section of an individual laser beam (therefore also called a scraper mirror) and transmits an area of the beam cross-section. A plate stack with a plurality of plates rotated against each other in the shape of a fan may also be used as a beam splitter device for cutting or dividing an overlapped laser beam into two or more partial beams.

Alternatively or additionally it is also possible to use a beam forming device with a beam splitter device that has two plane-parallel mirror surfaces arranged at a short distance from each other for dividing an obliquely striking laser beam, as described, for example, in U.S. Pat. No. 5,825,551. Such a beam splitter device is suitable for converting the beam parameter product or beam quality factor $M_x^2$, $M_y^2$ of an (overlapped) laser beam in two directions x and y orthogonal to each other. In particular, the two beam parameter products can in this case be harmonised with each other in both orthogonal directions, which increases the efficiency of the coupling into the optical fibre. The parallel aligned reflecting surfaces are arranged in the beam path in such a manner that the diameter of the laser beam is reduced in one direction by multiple reflections between the plates and is increased in the second direction. This type of beam division is particularly favourable when there is no path length compensation because in this case the laser beams emerging from the individual laser emitters may not be separated sufficiently precisely and partially overlap so that there is no clean imaging. The use of a beam splitter, e.g. in the form of a stepped mirror, could in this case result in major losses due to over-illuminating of the steps, which can be prevented by using plane-parallel plates since in this case no edge effects are produced.

A polarisation coupling device, for example, in the manner of a dielectric mirror or the like, can be used as a device for overlapping two or more overlapped laser beams or partial beams. The device for overlapping, e.g. in the form of a polarisation coupler, causes the two overlapped laser beams or partial beams to converge, thereby altering the beam profile.

A transformation device may also be used to alter or rotate the orientation of one or more of the overlapped laser beams as part of the beam forming device. For example the orientation of the overlapped laser beams or partial beams can be rotated in this manner by 90° so that a horizontal orientation of the beam cross-section of an overlapped laser beam or partial beam can be converted to a vertical orientation or vice versa. The rearrangement can be achieved by means of the above-mentioned devices that rotate the laser beams to rearrange them spatially. The orientation of the laser beam or beams can be rotated, for example, by means of a device that rotates the beam path, as described in U.S. Pat. No. 5,513,201.

As explained above, the overlapped beam or beams can be coupled into an optical fibre and the overlapped laser beam or beams can be used directly for material processing by means of a suitable beam guide. As the case may be, the laser radiation can be also be used for pumping a further laser, e.g. a solid state laser that can also be used, for example, for material processing. The beam guidance of the pump radiation can be achieved by means of absorbers, beam switches, beam splitters, etc. It is also possible to measure the power of the laser radiation supplied by the device and control it if necessary.

BRIEF DESCRIPTION OF THE DRAWINGS

Further advantages of the invention are evident from the description and the drawing. The features mentioned and described in further detail above may also be used individually or several of them may be used in combination. The embodiments shown and described must not be understood as a final enumeration but should be regarded as being of an exemplary nature to illustrate the invention.

FIG. 17 shows a representation of a laser bar with a plurality of stripe type laser emitters;

FIGS. 18a to c show representations of three different embodiments of stripe type laser emitters that have different beam quality factors; and FIG. 19 shows a representation of a beam forming device to form a beam profile formed by an overlapped laser beam.

DETAILED DESCRIPTION

Identical reference symbols are used in the following description of the drawings for the same components or components with the same function.

Figure 1:
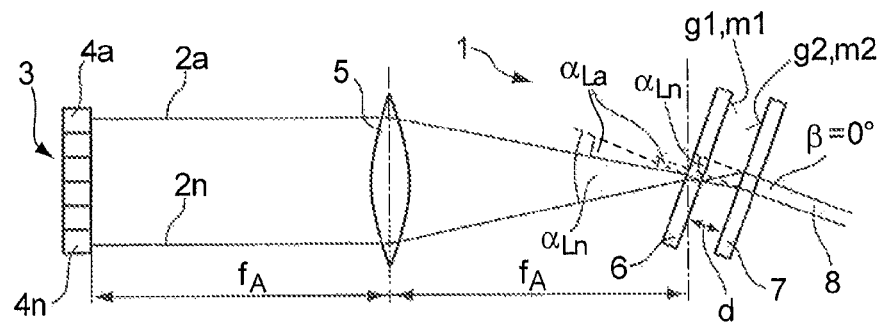
FIG. 1 shows a schematic representation of one embodiment of a device for wavelength coupling of laser beams that has a partially transmitting first diffraction grating as a feedback device and a transmitting second diffraction grating for dispersion-free overlapping of the laser beams.

FIG. 1 shows a device 1 for the wavelength coupling of laser beams $2a \ldots 2n$ with respective different wavelengths $\lambda_1 \ldots, \lambda_n$, that are generated by a laser source 3. For generating the laser beams $2a, \ldots, 2n$ the laser source 3 has a corresponding number of laser bars $4a, \ldots, 4n$ that form a vertical stack and which are cooled by a DCB heat sink (not shown) on their rear side. It is evident that laser beams $2a, \ldots, 2n$, which are generated by a plurality of emitters arranged on a single laser bar, can also be overlapped instead of laser beams $2a, \ldots 2n$, which are generated by different laser bars, wherein transformation optics (not shown) can be used, as the case may be, to change the orientation of the laser beams $2a, \ldots, 2n$. The laser beams $2a, \ldots, 2n$ can also be generated by a plurality of single or dual emitters, as will be explained in detail below.

The collimated laser beams $2a, \ldots, 2n$ to be overlapped strike a lens 5 that may be designed as a cylindrical lens or a spherical lens. The light-emitting surfaces of the laser emitters of the laser bars $4a, \ldots, 4n$ lie in a common plane that runs perpendicularly to the drawing plane. The common plane forms a first focal plane of the lens 5, i.e. the lens 5 is arranged at a certain distance from the light-emitting surfaces of the laser bars $4a, \ldots, 4n$, a distance that is equal to the focal length $f_A$ of the lens 5. A feedback device, in the form of a partially reflecting angle-dispersive optical element, which in the present example is designed as a first, partially reflecting diffractive grating 6, is arranged at a distance to the lens 5 that is essentially equal to the focal length $f_A$ of the lens 5. When a lens 5 in the form of a cylindrical lens is used, a beam telescope (not shown) is typically provided to increase feedback efficiency. If a spherical lens 5 is used, a beam telescope for the feedback may possibly be dispensed with.

The spatial distribution in the plane of the light-emitting surfaces of the laser emitters of the laser bars $4a, \ldots, 4n$ is converted to an angular distribution by the device shown in FIG. 1, i.e. each of laser beams $2a, \ldots, 2n$ strikes the diffraction grating 6 at a different angle $\alpha_{La} \ldots, \alpha_{Ln}$. The partially reflecting diffraction grating 6 is arranged at the Littrow angle to the striking laser beams $2a, \ldots 2n$, so that the emergent angle of the diffraction grating 6 of the proportion of radiation of a respective laser beam $2a, \ldots, 2n$ reflected back corresponds to the angle of incidence.

The following applies to each of the striking laser beams $2a, \ldots, 2n$:

$$\sin(\alpha_{Li}) = m_1 \lambda_i / (2g_1)$$

where i=a to n (or 1 to n), $m_1$ denoting the diffraction order, $\alpha_{Li}$, the angle of incidence and $\lambda_i$ the wavelength for which the Littrow condition is met and $g_1$ the grating constant of the diffraction grating 6. As can be seen in FIG. 1 the diffracting structures are arranged on the side of the diffraction grating 6 or on its transmissive base body facing away from the laser source 3. The relation indicated above also applies in this case because the effect of the angular variation of laser beams $2a, \ldots, 2n$ during the ingress from the optically thinner medium into the optically denser medium of the diffraction grating 6 and the effect of the variation in the wavelengths of the laser beams $2a, \ldots, 2n$ in the optically denser medium are mutually compensating.

The proportion of radiation of the striking laser beams $2a, \ldots, 2n$ reflected back to the laser bars $4a, \ldots, 4n$ allows wavelength stabilisation within a narrow bandwidth by the respective wavelength $\lambda_i$, which may be approx. 0.1 nm to 0.4 nm. The properties of the diffraction grating 6 in terms of the proportion of radiation reflected or transmitted, may be selected, among other things, as a function of the type of laser emitters generating the laser beams $2a, \ldots, 2n$ to provide effective feedback or wavelength stabilisation. For example, a radiation proportion of approx. 10% can be reflected on diffraction grating 6 and a radiation proportion of approx. 90% can be transmitted, which is made possible, for example, by a suitable choice of properties of a partially reflecting coating applied to the diffraction grating 6. With suitably optimised laser bars $4a, \ldots, 4n$ (e.g. with specially adapted reflectivity of the front facets and/or a suitably adapted length of the cavity) it is also possible to use the diffraction grating 6 with a reflectivity in a range of 2-8%.

An overlapping device in the form of an angle-dispersive optical element, which in the present example is designed as a (second) transmissive diffraction grating 7, is arranged in the device 1 for the wavelength overlapping of the laser beams $2a, \ldots 2n$, which are transmitted by the first diffraction, grating 6. It is advantageous for the second diffraction grating 7 to be installed in the immediate vicinity of the first diffraction grating 6, i.e. when the distance d between the diffraction gratings 6, 7 aligned in parallel with each other is less than approx. 10 mm.

The properties of the first diffraction grating 6 and the properties of the second diffraction grating 7 are matched to each other so that the overlapped laser beam 8 leaves the second diffraction grating 7 at essentially the same emergent angle $\beta$ (ideally at the same emergent angle $\beta$).

In the present example, where the diffraction gratings 6, 7 are aligned parallel with each other, the emergent angle $\beta$ of the overlapped laser beam 8 is 0° because in this case the emergent angle on the second diffraction grating 7 is independent of the wavelength of the overlapped laser beams $2a, \ldots, 2n$ if the grating constant $g_2$ and the diffraction order $m_2$ of the second diffraction grating 7 are suitably chosen. As is evident from equations (1) and (2) described above, this is the case when the diffraction gratings 6, 7 meet the following condition: $m_2/g_2 = m_1/(2 g_1)$. If this condition is met, an essentially dispersion-free overlapping of the laser beams $2a, \ldots, 2n$ to one overlapped laser beam 8 can be achieved. As can be seen in FIG. 1, the diffractive structures of the second diffraction grating 7 are arranged on its side facing the first diffraction grating 6. The beam quality can be improved or maintained by arranging the diffractive structures on sides of the diffraction gratings 6, 7 facing each other.

Figure 2:
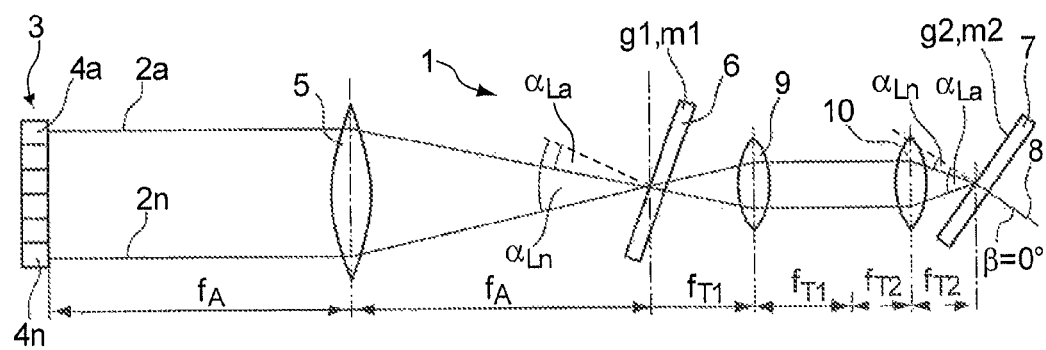
FIG. 2 shows a representation similar to FIG. 1 in which a beam telescope is arranged between the first and the second diffraction grating.

FIG. 2 shows a device that differs from the device shown in FIG. 1 in that a beam telescope, which in the present example is formed by a first and second lens 9, 10 that are arranged at a distance of the sum of their focal lengths $f_{T1} + f_{T2}$ to each other, is arranged in the beam path between first the diffraction grating 6 and the second diffraction grating 7. The first diffraction grating 6 is arranged at a distance from the first lens 9 that is essentially equal to its focal length $f_{T1}$, and second the diffraction grating 7 is arranged at a distance from the second lens 10 that is equal to its focal length $f_{T2}$. In this case the following applies to the imaging ratio A (more accurately |A|) of the beam telescope 9, 10: $A = f_{T2}/f_{T1}$.

To obtain in this case a dispersion-free overlapping of laser beams $2a, \ldots, 2n$ to form an overlapped laser beam 8, the relationship indicated above between the properties of the diffraction gratings 6, 7 must be modified taking into consideration the imaging ratio A of the beam telescope 9, 10: To achieve a wavelength-independent emergent angle $\beta = 0°$, the condition $A\, m_2/g_2 = m_1/2\, g_1)$ must be met in this case. In the arrangement shown in FIG. 2 the beam path between the diffraction gratings 6, 7 is enlarged. This can be used, for example, to operate the second diffraction grating 7 in reflection or configure it so that it is fully reflecting. The overlapped laser beam 8 must in this case be guided away in a suitable way from the path of the laser beams $2a, \ldots, 2n$ to be overlapped.

Figure 3:
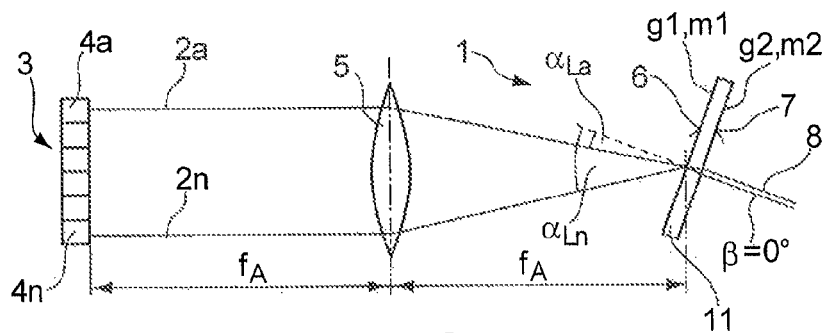
FIG. 3 shows a representation similar to FIG. 1 in which the first and second diffraction gratings are installed on a common transmitting base body.

As explained in the following with reference to FIG. 3, it is also possible to design both diffraction gratings 6, 7 as a common optical element. In this case the diffraction gratings 6, 7 are installed on two opposing surfaces of a transmitting base body 11, where parallel alignment of the grating planes of the two diffraction gratings 6, 7 is advantageous. Since the transmitting base body 11 has a refractive index $n_2$ that deviates from the refractive index of the surrounding medium $n_1 = 1.0$, laser beams $2a, \ldots, 2n$ are refracted on entering the base body 11 so that they no longer strike the second diffraction grating 7 at the respective Littrow angle $\alpha_{La}, \ldots, \alpha_{Ln}$. However, the variation in wavelength in the optically denser medium results in a modification of the grating equation (cf. condition (2')). In the case of a surrounding medium with $n_1 = 1.0$, the above conditions (1) and (2'), for the properties of the diffraction gratings 6, 7 for generating a dispersion-free overlap do not give rise to any modification, so that the following applies, as in FIG. 1: $m_2/g_2=m_1/(2\ g_1)$. The (common) emergent angle β is also typically 0° in this case.

Instead of an overlapping device in the form of the second diffraction grating 7, another angle-dispersive optical element can also be used, e.g. a prism whose properties (refractive index or apex angle) are adapted to the properties of the first diffraction grating 6 to achieve dispersion-free overlapping. To generate the angle spectrum on the first partially reflecting diffraction grating 6, a beam deflection device may be used instead of an imaging optical element, as will be explained in greater detail below.

Figure 4A:
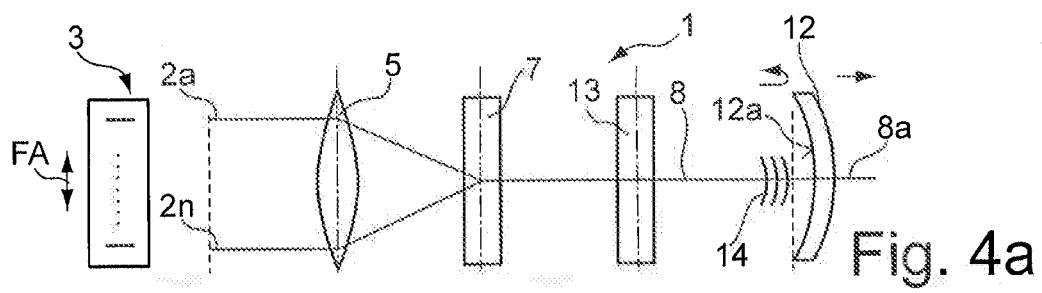
FIGS. 4a and b show schematic representations of a device for wavelength coupling that has a feedback device in the form of an output coupling element whose partially reflecting surface is shaped cylindrically for phase correction of the proportion of the radiation reflected back to the laser source.
Figure 4B:
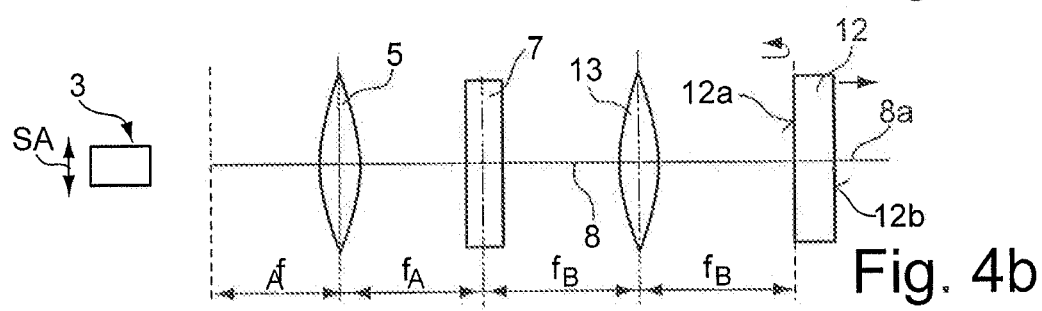

Instead of a feedback device arranged in the path of the laser beams 2a, ..., 2n to be overlapped, it is also possible to use a feedback device that is arranged in the path of the overlapped laser beam 8, as is described below with reference to a device 1 shown in FIGS. 4a, b. In FIG. 4a the device is shown in the plane in which overlapping direction FA is located, and in FIG. 4b it is shown in a plane perpendicular to it, in a second direction SA perpendicular to the first. The laser beams 2a, ..., 2n to be overlapped are generated by a laser source of which an elevation of the front side, with the beam-emitting surfaces, is shown in FIG. 4a. The laser source 3 may be designed to generate the beam profile shown in FIG. 4a in different ways, as described in more detail below.

The laser beams 2a, ..., 2n are overlapped in the overlapping direction FA denoted in FIG. 4a by a double arrow by imaging them, as explained in connection with FIG. 1, by means of a spherical lens 5 on a diffraction grating 7 serving as an overlapping device, giving rise to a place-to-angle transformation. Contrary to the wavelength stabilisation described in connection with FIG. 1 to FIG. 3, using a feedback device arranged in the path of the laser beams 2a, ..., 2n to be overlapped, a partially reflecting output coupling element 12 is used in FIG. 4a,b as the feedback device, which element is arranged in the path of the overlapped laser beam 8. The partially reflecting outcoupling element 12 has for this purpose a partially reflecting surface 12a that may be designed, for example, in the form of a reflecting coating applied to a transmitting base body. A radiation proportion transmitted by output coupling element 12 leaves the device 1 as an outcoupled, overlapped laser beam 8a.

As can be seen in FIG. 4a the overlapped laser beam 8 has a wave front 14 that is essentially spherically curved. The reflection of the radiation proportion of the overlapped laser beam 8 fed back to the laser source 3 on an outcoupling element with a flat, partially reflecting surface would mean, because of the non-flat wave front 14, that the radiation proportion reflected back to the laser source 3 does not strike a respective laser emitter sufficiently precisely, thereby impairing wavelength stabilisation and increasing, the spectral bandwidth of the emitted laser beams 2a, ..., 2n. To improve the coupling of the radiation proportion reflected back to the laser source 3 into the laser emitters (not shown in FIGS. 4a,b), the partially reflecting surface 12a is cylindrically curved (concave), the radius of curvature of surface 12a being adapted to the radius of curvature of wave front 14, i.e. corresponds essentially to it. This ensures that the radiation proportion of the overlapped laser beam 8, reflected back, can be coupled with a high degree of precision into the laser emitters and the efficiency of the feedback can be considerably improved.

A further cylindrical lens 13 (with a focal length $f_B$) is arranged between the diffraction grating 7 and the output coupling element 12, which lens, together with the spherical lens 5 generating the place-to-angle transformation, forms a beam telescope. Beam telescope 5, 13 is used to achieve $4f$ imaging between a focal plane of the spherical lens 5 in which the light-emitting surfaces of the laser emitters (not shown) are located, and a plane in which is arranged the partially reflecting surface 12a. The efficiency of the feedback in the SA direction can be increased by the $4f$ imaging with the aid of the beam telescope 5, 13.

The output coupling element 12 is designed as a meniscus lens in the example shown in FIGS. 4a,b, and has on the outcoupling side a convexly curved surface 12b that is used for beam forming the outcoupled overlapped laser beam 8a. In this example the curvature on the outcoupling side is chosen so that the outcoupled overlapped laser beam 8a exits collimated from the device 1. It is evident that the beam forming of the outcoupled overlapped laser beam 8a can also be achieved by means other than providing a curved surface 12b.

Figure 5A:
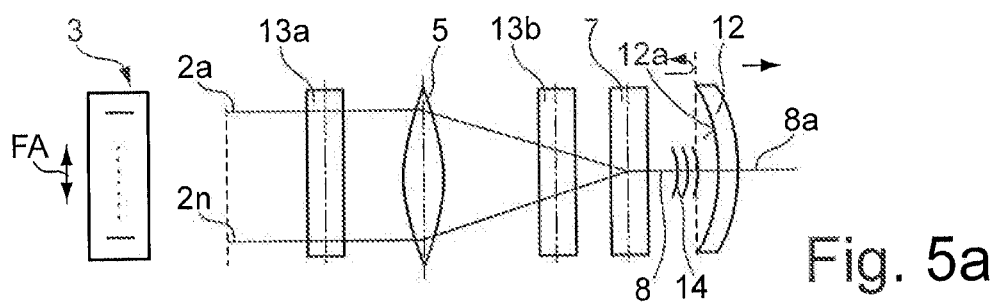
FIGS. 5a to c show representations similar to FIGS. 4a and b in which a beam telescope arranged in the beam path before the second diffraction grating is provided to increase the feedback efficiency.

The device 1 shown in FIGS. 5a, b differs from the device 1 in FIGS. 4a, b in that instead of a spherical lens a cylindrical lens 5 is used for achieving the place-to-angle transformation in the FA direction and in that the beam telescope in the SA direction is realised with two cylindrical lenses 13a, 13b that are arranged in the beam path before the diffraction grating 7 serving as the overlapping device. Because of the type of realisation of the device 1 shown in FIGS. 5a,b, the distance between the diffraction grating 7 and the outcoupling element 12 can be reduced relative to the embodiment shown in FIGS. 4a,b, which has a favourable effect on the beam quality.

Figure 5B:
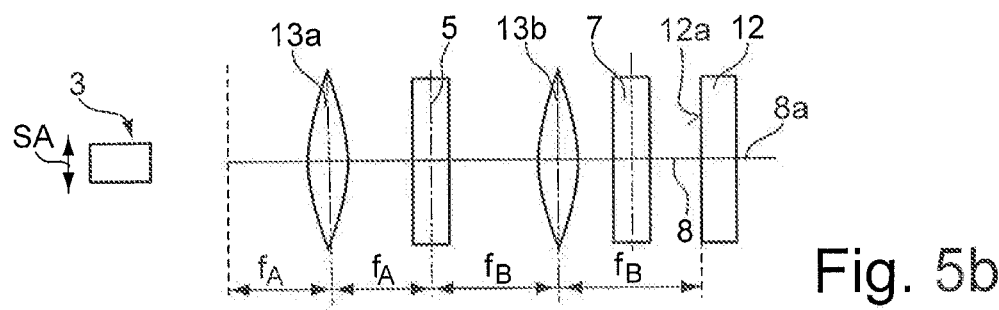
Figure 5C:
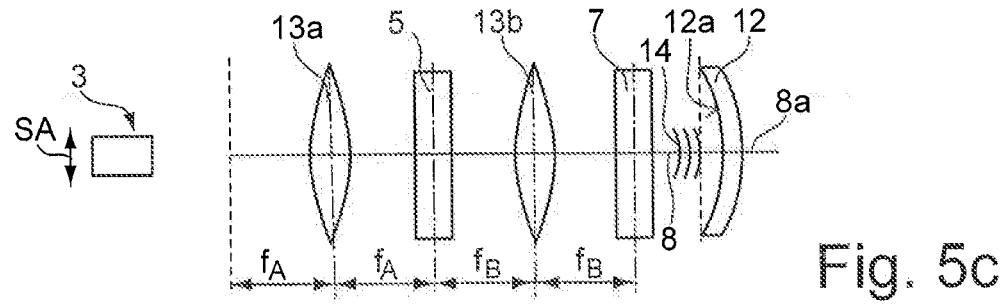

With the beam telescope it is possible, by adapting the focal lengths of the cylindrical lenses 13a, 13b, to locate the image of the laser beams anywhere in the device 1. A further particularly advantageous embodiment in which this possibility is used is represented in FIG. 5c, where here only the SA direction is shown (FA direction, e.g. as in FIG. 5a). The SA telescope may be designed, or the focal lengths $f_A$, $f_B$ of cylindrical lenses 13a, 13b may be chosen, so that the image is generated at the location of the diffraction grating 7 and the resultant curvature of the phase front in the SA direction can be compensated for with the output coupling element 12 curved in the SA direction, more precisely by means of a suitably curved reflecting surface 12a. It is particularly advantageous to select the focal lengths $f_A$, $f_B$ of the cylindrical lenses 13a, 13b so that, as described below in connection with FIG. 7a,b, the output coupling element 12 can be designed purely spherically. It is evident that contrary to what is shown in FIG. 5b and FIG. 5c, the focal plane formed between the two cylindrical lenses 13a, 13b, need not be at the position of focussing lens 5, but can also be arranged offset to this position.

Figure 6A:
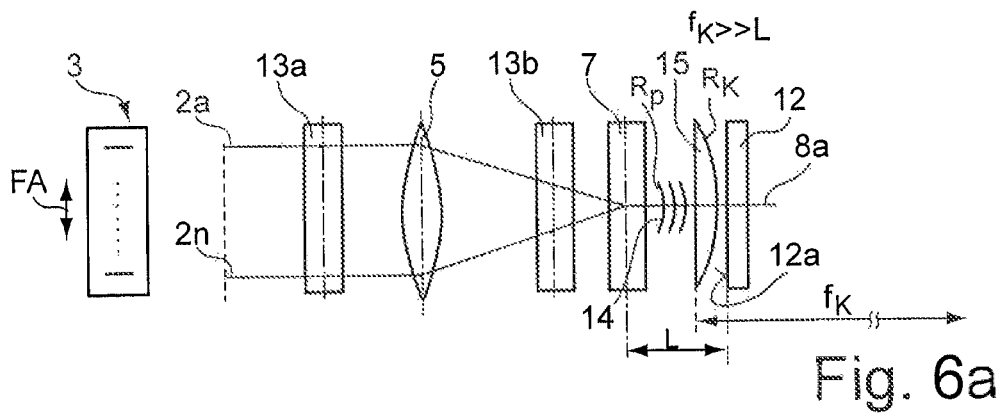
FIGS. 6a and b show a representation similar to FIGS. 4a and b in which a cylindrical lens serves as a phase correction device and a beam telescope is provided for optimising the feedback of the reflected proportion of radiation into the laser source.
Figure 6B:
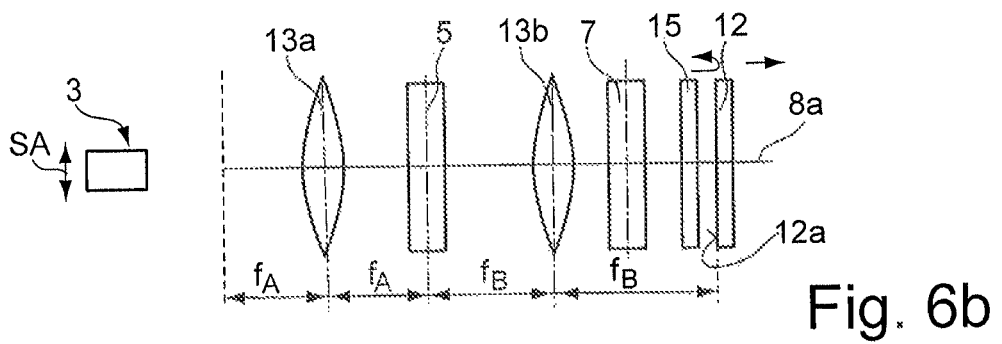

The device 1 shown in FIGS. 6a,b differs from the device 1 shown in FIGS. 5a,b essentially in that the partially reflecting surface 12a of the output coupling element 12 is of a flat design. As a phase correction element a cylindrical lens 15 is used in this case, for example in the form of a plano-convex lens that collimates the overlapped laser beam 8 before it strikes the flat surface 12a of the output coupling element 12. The lens curvature or radius of curvature $R_K$ of the cylindrical lens 15 serving as the phase correction element is adapted to the radius of curvature $R_P$ of the wave front 14, i.e. both radii correspond (approximately). Because of the comparatively large radius of curvature $R_P$ of the wave front 14, which generally exceeds two meters, the focal length $f_K$ of the cylindrical lens 15 is also more than approx. two meters (only shown in FIG. 6b), and is therefore much greater than the distance L between the diffraction grating 7 serving as the overlapping device and the output coupling element 12, which is typically between approx. 2 cm and approx. 20 cm.

Figure 7A:
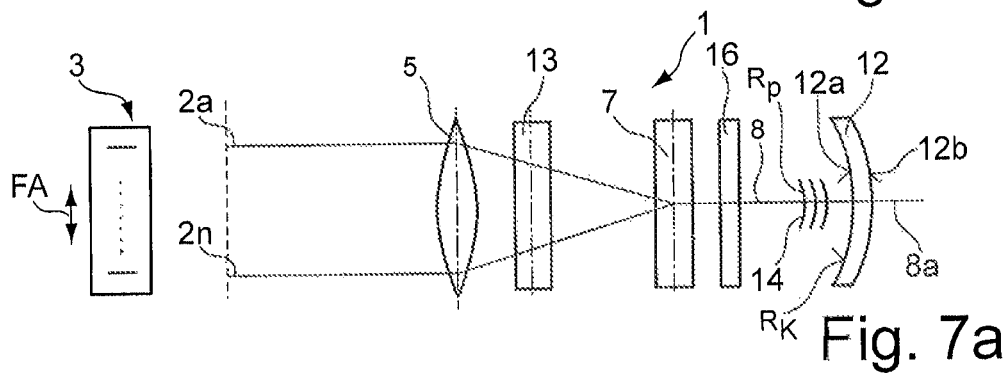
FIGS. 7a and b show a representation similar to FIGS. 4a and b in which the output coupling element has a spherically curved partially reflecting surface and a polarisation filter is provided for filtering undesirable radiation proportions during the feedback.
Figure 7B:
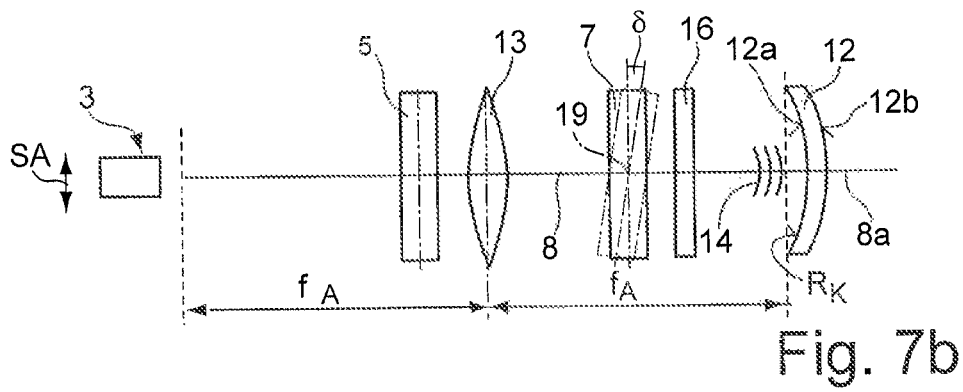

FIGS. 7a, b shows a device that differs from the device 1, shown in FIGS. 4a, b, among other things, in that the output coupling element 12 has a partially reflecting spherically curved concave surface 12a and a corresponding spherically curved convex surface 12b on the outcoupling side. To achieve a phase correction and hence optimisation of the feedback both in the overlapping direction FA shown in FIG. 7a and in a direction perpendicular to it, it is typically necessary to select different refractive forces of the participating phase correction elements in both directions because the curvature of wave front 14 typically differs in the two directions.

In the example shown in FIGS. 7a,b, the phase correction or radius of curvature $R_K$ of the spherically curved partially reflecting surface 12a is chosen so that it is equal to the radius of curvature $R_P$ of the wave front 14 in the overlapping direction FA (cf. FIG. 7a). If the radius of curvature of the wave front 14 deviates in the overlapping direction FA from that in the direction perpendicular to it, the plane with the partially reflecting surface 12a can be imaged on the plane with the beam emitting surfaces of the laser emitters (not shown) by means of a cylindrical lens 13 to optimise the feedback, also in the direction SA perpendicular to the overlapping direction FA, thereby minimising feedback losses in both directions and dimensions. To optimise the feedback both in the FA direction and the SA direction the use of optical correction elements with different refractive forces in the FA direction and SA direction is generally required.

In addition to the partially reflecting spherically curved optical surface 12a serving as a phase correction device, a polarisation filter 16, which filters out undesirable polarisation proportions, in particular undesirable TM modes generated by the laser emitters (not shown) of laser source 3, is arranged in the path of the overlapped laser beam 8, so that they are not reflected back to the laser source 3 and coupled into the laser emitters provided there. In this case use is made of the fact that the laser radiation emitted by a respective laser emitter has a radiation proportion (or intensity proportion) of typically more than approx. 95% with linear polarisation in one main polarisation direction, and only a radiation proportion of approx. 5% is not polarised in the main polarisation direction. The proportion of the laser radiation that is polarised in the main polarisation direction and has a higher beam quality than the radiation proportion not polarised in the main polarisation direction, with the result that the beam quality and feedback efficiency of the proportion of radiation reflected back to the laser source 3 can be increased by the provision of the polarisation filter 16, which filters out the radiation proportions not polarised in the main polarisation direction.

In the example shown in FIGS. 7a, b, the polarisation filter 16 is arranged in the path of the overlapped laser beam 8 between the overlapping device 7 and the output coupling element 12. The overlapped laser beam 8 is essentially collimated, which has a favourable effect on the polarisation filtering. It is evident that the polarisation filter 16 can be used advantageously also with the devices 1 described above in connection with FIGS. 1 to 6a,b. It is also evident that the polarisation filter 16 must be arranged in the beam path between the laser source 3 and the feedback device, so that the polarisation filter 16 for the devices 1 shown in FIGS. 1 to 3 must be arranged in the path of the laser beams 1a, . . . , 2n to be overlapped. In the case of the devices 1 shown in FIGS. 4a,b to 7a,b, the polarisation filter 16 can be arranged in the path of the laser beams 2a, . . . , 2n to be overlapped.

As an alternative to the devices 1 described in connection with FIGS. 4a,b to 7a,b, the output coupling element 12 may have a partially reflecting surface that has a different curvature in two directions, i.e. is designed in the manner of a cross cylinder. In particular, an output coupling element 12 with a spherically curved or, as the case may be, aspherical curvature, for example, can be used in the case of the devices 1 described in connection with FIGS. 4a,b and 5a,b, instead of an output coupling element 12 with a partially reflecting cylindrically curved surface 12a.

In the examples shown, a phase correction device in the form of a phase correction plate (not shown) can also be used to adjust individually, at any point on the beam cross-section of the overlapped laser beam 8, the phase correction, more precisely the deviation from the curved partially reflecting surface 12a, or the phase correction generated by the collimating lens 15. It is evident that the phase correction can, if necessary, also be carried out exclusively by a phase correction plate arranged in the path of the overlapped laser beam 8.

In the examples shown in FIGS. 4 to 7, where the feedback takes place in the beam path behind the overlapping device 7, it is surprisingly easy to adjust the wavelengths of the laser beams 2a, . . . , 2n of laser source 3 to be stabilised. For this purpose the diffraction grating 7, as shown by way of example in FIG. 7b, is rotated about an axis of rotation 19 perpendicular to the drawing plane at an angle of rotation δ, thus altering the angle or angles of incidence of the laser beams 2a, . . . 2n on the diffraction grating 7 and hence also the wavelengths of the laser beams 2a, . . . , 2n stabilised by the device 1.

Figure 8:
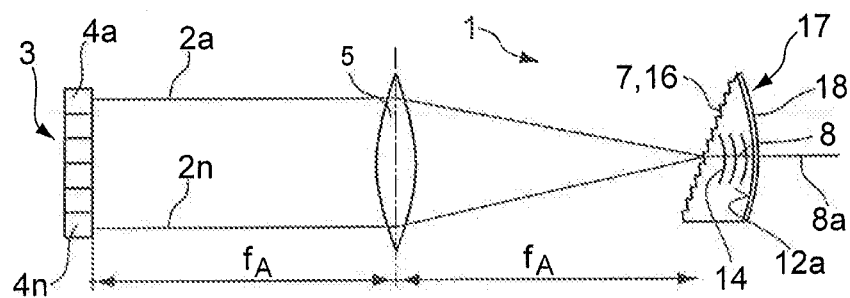
FIG. 8 shows a representation of a device for wavelength coupling in which a diffraction grating serving as an overlapping device and a feedback device, in the form of a partially reflecting outcoupling element, are provided on a common base body.

FIG. 8 shows an embodiment of the device 1 that differs from the devices described above in that the overlapping device is designed in the form of a diffraction grating 7 and the feedback device in the form of the partially reflecting surface are designed as a common optical element 17. The common optical element 17 has a transmissive base body for the laser radiation on whose one front side the diffraction grating 7 is arranged for overlapping and to whose second opposing front side 12a a partially reflecting coating 18 is applied to reflect a radiation proportion of the overlapped laser beam 8 back to light source 3. The front side 12a of the essentially prism-shaped optical element 17, with the partially reflecting coating 18, has a curvature that is adapted to the curvature of the wave front 14, so that the optical element 17 also serves as a phase correction element.

In the design shown in FIG. 7, the diffraction grating 7 is designed as a polarisation filter 16 since the diffraction grating 7 is provided with a polarisation-selective coating. Correspondingly the overlapping device 7 or the feedback device 6, 12 may also be designed as polarisation filters in the embodiments described above. It is evident that the combination of the polarisation filter and the feedback or overlapping device can be achieved in a manner other than a dielectric coating.

Figure 9:
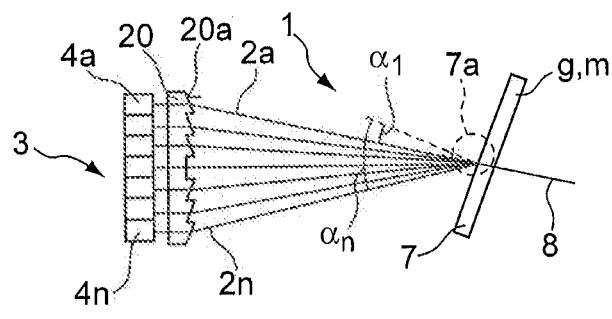
FIG. 9 shows a beam deflection device in the form of a facet element for aligning a laser beam to a common overlapping area on the overlapping device.

As an alternative to the place-to-angle transformation shown in FIG. 1 for generating an angle spectrum on the angle-dispersive overlapping device 7, it is also possible to use a beam deflection device that aligns the laser beams 2a, . . . , 2n to be overlapped at different angles $α_1$ to $α_n$ to a common overlapping area 7a of the overlapping device 7. As shown in FIG. 9, this can be achieved by means of a transmissive facet element 20, which has a plurality of wedge-shaped facets 20a. In this case a facet 20a is assigned to each laser beam to be overlapped, which facet is designed so that the striking laser beam 2a, . . . , 2n to be overlapped is refracted so that it strikes the (approximately) punctiform overlapping area 7a of the overlapping device designed as a diffraction grating 7 (with grating constant g or diffraction order m). It is evident that in the devices 1 described in connection with FIGS. 1 to 3 the overlapping area 7a can also be formed on the first diffraction grating 6 serving as a feedback device. The facet element 20 has the advantage that the device 1 is more compact than can be achieved with a transformation lens because the distance between the light source 3 and the facet element 20 selected can be very short. Unlike the design shown in FIG. 7, the facet element 20 can be connected directly to the light source 3. In devices with beam deflection devices, e.g. the facet element 20 shown in FIG. 9, it is particularly practical to provide a phase correction of the overlapped laser beam 8, as shown in FIGS. 4 to 8.

The facet element 20 shown in FIG. 9 can be combined with a further facet element (not shown), where two facets of the two facet elements interact in the manner of an anamorphotic prism pair to increase the filling factor in the alignment of the laser beams 2a, . . . , 2n to be overlapped to the overlapping area 7a of the overlapping device designed as a diffraction grating 7. The increase in the filling factor by means of such a prism arrangement is described in greater detail below.

Figure 10:
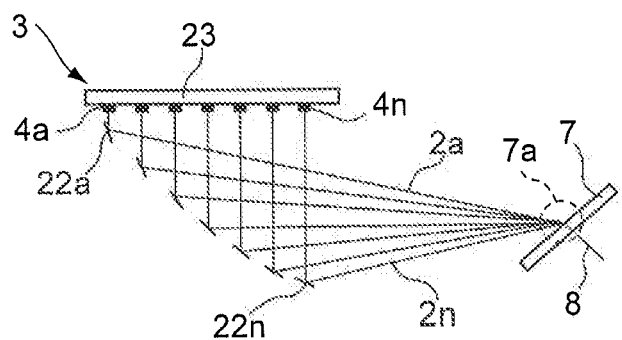
FIG. 10 shows a beam deflection device that has a plurality of deflecting mirrors for aligning a respective laser beam to the common overlapping area.

FIG. 10 shows a detail of a device 1 that also has a beam forming device that has a number of deflection mirrors 22a, . . . , 22n corresponding to the number of laser beams 2a, . . . , 2n to be overlapped. The laser beams 2a, . . . , 2n to be overlapped are generated in this example by a laser source 3 that has a plurality of laser bars 4a, . . . , 4n that are arranged in the form of a vertical stack and which are cooled on the rear side by means of a common DCB heat sink 23 serving as a carrier, so that a high filling factor, i.e. a short distance between the laser bars 4a, . . . , 4n can be achieved. It is evident that the laser bars 4a, . . . , 4n, unlike the design shown in FIG. 10, can be arranged not at a constant but at a different distance from each other.

The flat deflection mirrors 22a, . . . , 22n are positioned and aligned at such an angle to the laser bars 4a, . . . , 4n so that they strike the common overlapping area 7a on the overlapping device 7. To increase the efficiency of the feedback into the laser bars 4a, . . . , 4n, it may be advantageous for the path lengths between the laser bars 4a, . . . , 4n and the overlapping area 7a to be of the same size. Because of the existing degrees of freedom in terms of positioning and the angles of deflection of the deflection mirrors, the condition of the same path lengths can generally be met. Depending on the quality of collimation of the laser beams 2a, . . . , 2n to be overlapped, as the case may be, the same path length requirement may be dispensed with.

Figure 11A:
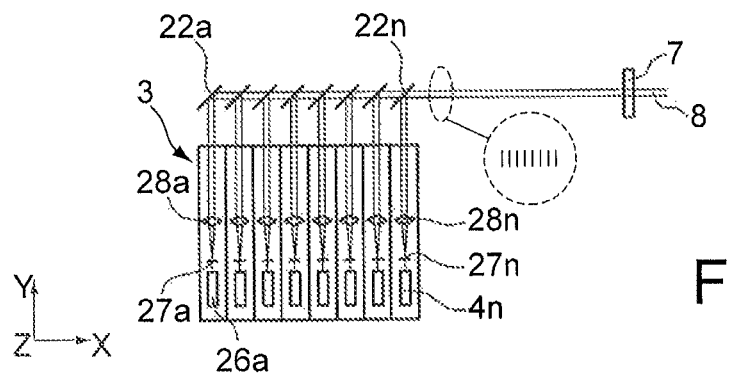
FIGS. 11a and b show a beam deflection device in an elevation and a side view in which a plurality of laser beams of an optical module are aligned via deflecting mirrors to the common overlapping area.

Overlapping by means of a beam forming device that has a plurality of deflection mirrors 22a, . . . , 22n for aligning laser beams 2a, . . . , 2n to be overlapped to a common overlapping area 7a of an overlapping device 7 is also shown in FIGS. 11a,b. In the arrangement shown in FIGS. 11a,b, an optical module 25, which has a plurality (eight in this example) of single emitters 4a, . . . , 4n, which are arranged on different stages of a common heat sink 26, serves as a laser source 3.

To each single emitter 4a, . . . , 4n is assigned a first collimation lens 27a, . . . , 27n, which serves to collimate the laser beams 2a, . . . , 2n in the FA direction (corresponding to the Z-direction of an XYZ coordinate system). A second collimation lens 28a, . . . , 28n is used to collimate a respective laser beam 2a, . . . , 2n in a second vertical direction (SA direction), which corresponds to the X-direction of the arrangement shown in FIGS. 11a,b. To enable the collimated laser beams 2a, . . . , 2n to be overlapped in the common overlapping area 7a of the overlapping device 7, the deflection mirrors 22a, . . . , 22n, or more precisely their mirror planes, are inclined or tilted relative to the XY-plane, as indicated in FIG. 11b.

Figure 11B:
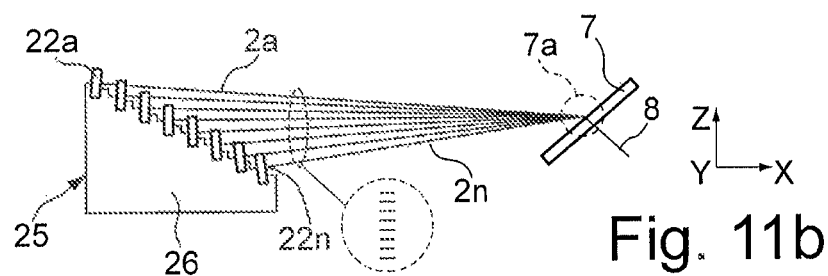
FIG. 11c shows an arrangement in which the optical module can also be aligned in parallel.

The beam profile generated by the optical module 25 is shown in FIG. 11a and FIG. 11b in the YZ-plane. The beam emitting profile that is generated by the optical module 25 has a plurality (in this example eight) laser beams 2a, . . . , 2n arranged one above the other in one dimension or direction. The dimension in which the stacking or arrangement of laser beams 2a, . . . , 2n takes place is in this case the Z-direction, which corresponds to the FA direction of the laser emitters 4a.

Figure 11C:
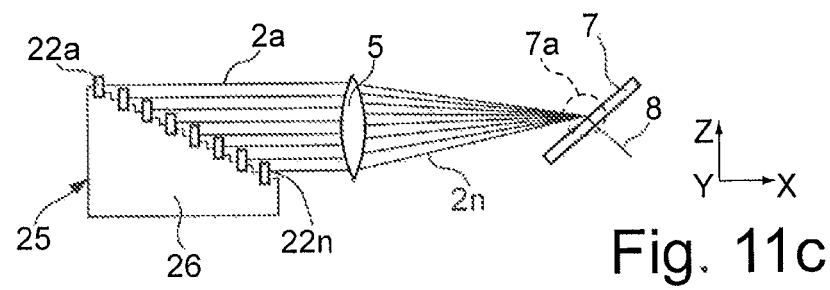

As shown in FIG. 11c, the deflection mirrors 22a, . . . , 22n in the optical module 25 can also be aligned in parallel so that the deflected laser beams 2a . . . 2n run parallel with each other. To enable the collimated laser beams 2a, . . . , 2n to be overlapped in the common overlapping area 7a of the overlapping device 7, a transformation lens 5 is used in this example.

Figure 12A:
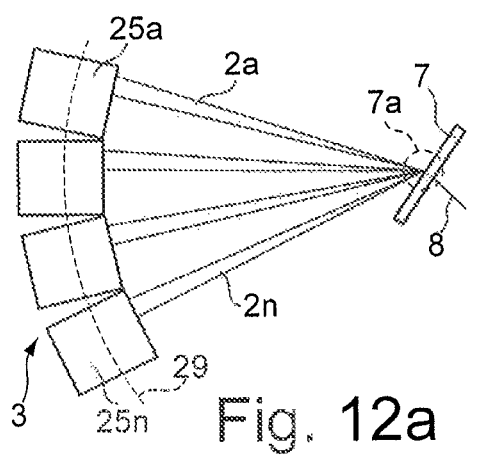
FIGS. 12a and b show beam deflection devices with a plurality of optical modules that are arranged on an arc of a circle to align the laser beams generated by them to the overlapping area.

Whilst in the arrangement shown in FIGS. 11a, b the laser beams 2a, . . . , 2n of a plurality of single emitters 4a, . . . , 4n is overlapped, overlapping takes place in the arrangement shown in FIG. 12a of laser beams 2a, . . . , 2n that are generated by a laser source 3 with a plurality (four in the example shown) of optical modules 25a, . . . , 25n, which are designed as shown in FIGS. 11a, b. The optical modules 25a, . . . , 25n are arranged on a common arc 29 for overlapping in the overlapping area 7a of the overlapping device 7, and are aligned to the overlapping area 7a that is located roughly at the centre of the arc 29.

Figure 12B:
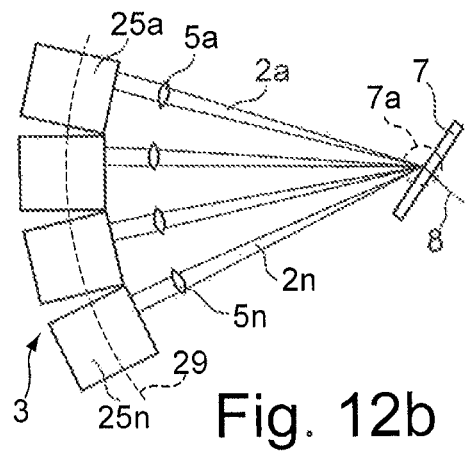
FIG. 12c shows an alternative arrangement.

FIG. 12b shows an arrangement in which optical modules 25a, . . . , 25n each radiate a collimated laser beam 2a, . . . , 2n (or a collimated laser beam bundle) (cf. FIG. 11c). To enable the collimated laser beams 2a, . . . , 2n to be overlapped in the common overlapping area 7a of the overlapping device 7, a transformation lens 5a, . . . , 5n is arranged after each optical module 25a, . . . , 25n.

Figure 12C:
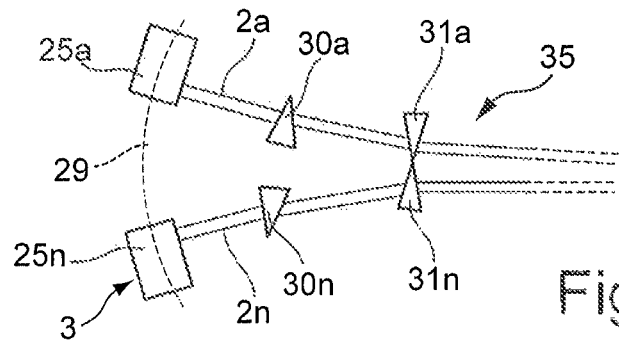

FIG. 12c shows an arrangement similar to FIG. 12a in which an optical device 35, with a plurality (in this example four) wedge-shaped deflection prisms 30a, 30n, 31a, . . . , 31n is provided between the optical modules 26a, . . . , 25n and the overlapping device (not shown in FIG. 12b), which prisms deflect the laser beams 2a, . . . , 2n aligned to the common centre, thus reducing the distance between the deflected laser beams 2a, . . . , 2n striking the overlapping device and therefore increasing the filling factor of the arrangement shown. In this case the two prisms 30a, 31a, . . . , 30n, 31n assigned to a respective laser beam 2a, . . . , 2n, interact in the manner of an anamorphotic pair of prisms.

The arrangement shown in FIG. 12c, more precisely the optical device 35, may also be designed as a fully reflective device. For this purpose the prisms 30a, 31a, . . . , 30n, 31n can be substituted by a facetted mirror or by single mirrors arranged close to each other. This is advantageous because the substrates used for the mirrors are less expensive that the substrates of the prisms 30a, 31, . . . , 30n, 31n.

Figure 13:
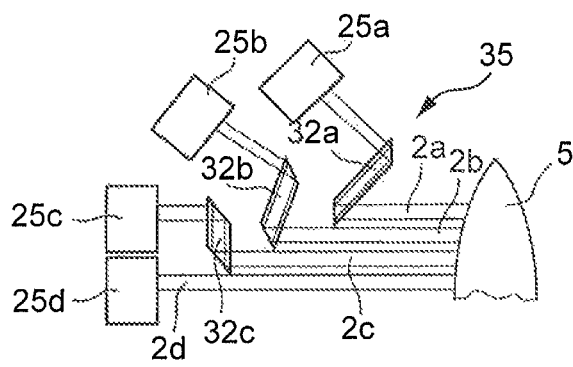
FIG. 13 shows a plurality of optical modules with a prism arrangement for the parallel alignment of the laser beams to them whilst increasing the filling factor.

FIG. 13 shows four laser beams 2a to 2d that are generated by four optical modules 25a to 25d and which are aligned in parallel by means of an optical device 35 in the form of three trapezoidal deflection prisms 32a to 32c to increase the filling factor. The laser beams 2a, . . . , 2d aligned in parallel strike a focussing lens 5, which serves to focus the laser beams 2a to 2d together with four further laser beams (not shown), which are generated by corresponding optical modules (not shown), to an overlapping area (not shown). The optical device 35 shown in FIG. 13 may also be provided with reflective optical components, as shown in connection with FIG. 12c. For example, a respective deflection prism 32a to 32c may be substituted by two deflection mirrors.

Figure 14:
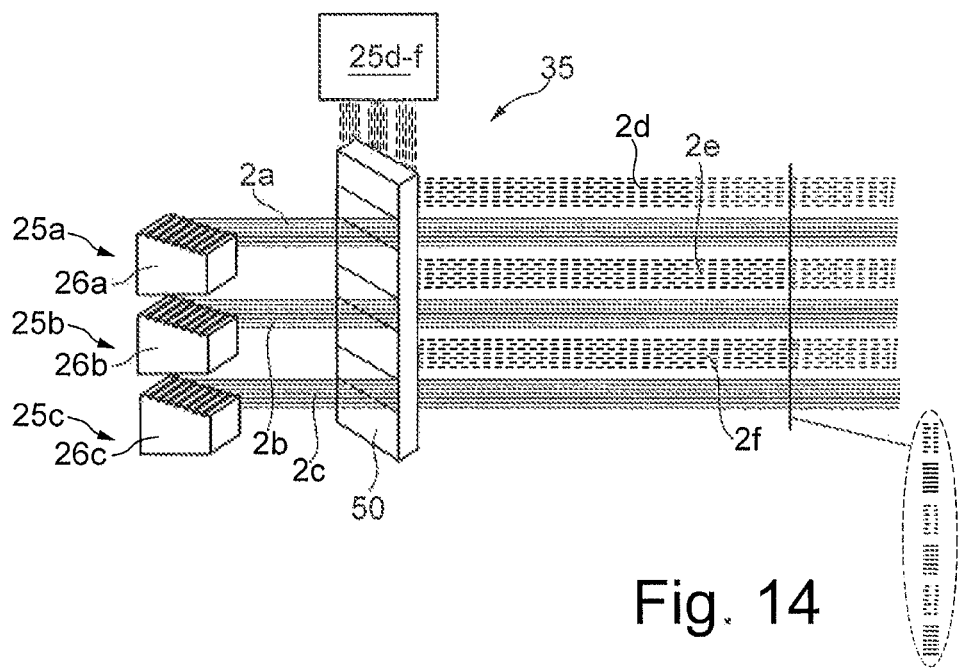
FIG. 14 shows a schematic representation of an optical device with a slit mirror for interleaving the laser beams generated by two stacks of optical modules.

FIG. 14 shows an optical device 35 that has an interleaving device in the form of a slit mirror 30 for interleaving a plurality of laser beams, more precisely laser beam bundles 2a, 2b, 2c, which are generated on three heat sinks 26a-c of three optical modules 25a-c, stacked one above the other, with three laser beam bundles 2d, 2e, 2f represented by dotted lines, which bundles are generated by three further optical modules 25d-f. The arrangement of the three further modules 25d-f (stacking) corresponds to that of the first three optical modules 25a-c. The three further optical modules 25d-f are arranged so that the laser beams 2d, 2d, 2f generated by them initially run perpendicular to the laser beams 2a, 2b, 2c of the first three optical modules 25a-c and are deflected on mirror surfaces that are applied to the back of the slit mirror 30, so that after the deflection they are aligned parallel with the laser beams 2a, 2b, 2c. The optical modules 25a, 25b, 25c can be stacked by means of a carrier (not shown) to which are fastened the heat sinks 26a-c. Contrary to what is shown in FIG. 15, stepped heat sinks 26a-c can also be arranged directly adjacent to each other, i.e. the underside of the second heat sink 26b is installed on the uppermost stage of the first heat sink 26a. Correspondingly the third heat sink 26c may be placed on the uppermost stage of the second heat sink 26b to form a vertical stack.

For the interleaving of the laser beams 2a-f, which are generated by two vertical stacks of optical modules 25a-c, 25d-f, it is advantageous for the respective laser beams or laser beam bundles 2a-c, 2d-f generated by a respective stack 25a-c, 25d-f to have a filling factor of approximately 50%, so that the interleaving can take place in such a manner that the gaps that are formed by the laser beams 2a-c of one stack of optical modules 25a-c are filled by the laser beams 2d-f of the other stack of optical modules 25d-f, as can be seen by the beam profile shown in FIG. 15.

FIGS. 13a, b show a further possibility of aligning a plurality (here: eight) laser beams 2a, . . . , 2n to a common overlapping area 7a that is formed on an overlapping device 7 in the form of a diffraction grating. The laser beams 2a, . . . , 2n are generated by laser emitters 4a, . . . , 4n, which are arranged in a common plane X, Y adjacent to each other on a laser bar 43.

The laser beams 2a, . . . , 2n emerging parallel with each other from the laser emitters 4a, . . . , 4n first strike a collimating lens 40, which in the example shown is arranged in a direction Z perpendicular to the common plane X, Y for collimating the laser beams 2a, . . . , 2n, which direction corresponds to the FA direction in the arrangement shown. The collimation lens 40 is designed as a cylindrical lens and extends in the Y-direction along the entire width of the laser bar 43.

In the beam path following collimation lens 40 is arranged a transformation device 41 that is used to rotate the orientation of the laser beams 2a, . . . , 2n (as an optical rotator) and which can be designed as described in US 2011/0216417 already cited. In the example shown in FIGS. 13a,b, an array of cylindrical lenses 44a, . . . , 44n is used as the optical rotator, which lenses effect a rotation of the alignment of laser beams 2a, . . . , 2n by 90°.

Figure 15A:
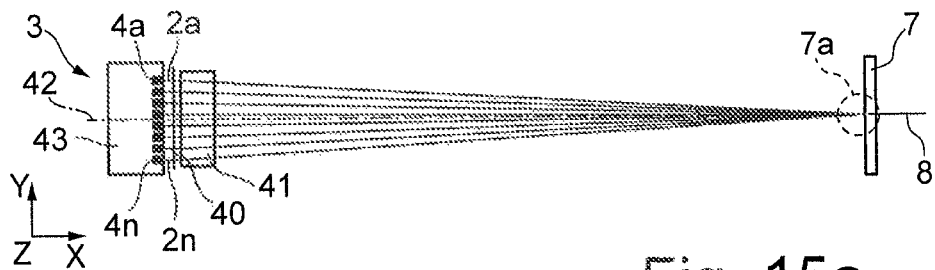
FIGS. 15a and b show a transformation device for rotating the orientation of a plurality of laser beams, which interacts with a collimation lens for aligning the laser beams to a common overlapping area.
Figure 15B:
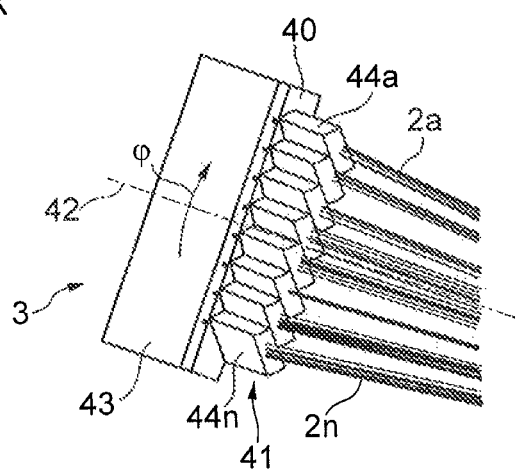

To effect the overlapping of the laser beams 2a, . . . , 2n by means of the arrangement shown in FIGS. 15a, b, the collimation lens 40 is rotated in relation to the XY-plane by an angle φ (cf. FIG. 15b) about an axis of rotation 42, which runs in the extension of overlapped laser beam 8 centrally through the laser bar 43. The angle φ by which collimation lens is rotated to the XY-plane is small, to effect the overlapping, being approx. 0.5° in this example. Because of the small angle of rotation φ, the collimation lens 40 is represented in FIG. 13b as a conventional collimation lens, i.e. with an alignment parallel with the XY-plane in which laser emitters 4a, . . . , 4n are arranged.

The rotation of the collimation lens 40 generates a respective different angle when the laser beams 2a, . . . , 2n enter the transformation device 41. The different angles on entering the transformation device 41 cause the laser beams 2a, . . . , 2n to run convergently when escaping from the transformation device 41, so that they can be aligned at a desired distance that can be varied by the amount of the angle of rotation φ to the common overlapping area 7a of the overlapping device 7. A rotation of the collimation lens 40 about the axis of rotation 42 in the opposite direction (angle of rotation −0.5°, for example) would, on the other hand, cause laser beams 2a, . . . , 2n to run divergently on emerging from the transformation device 41.

Figure 16A:
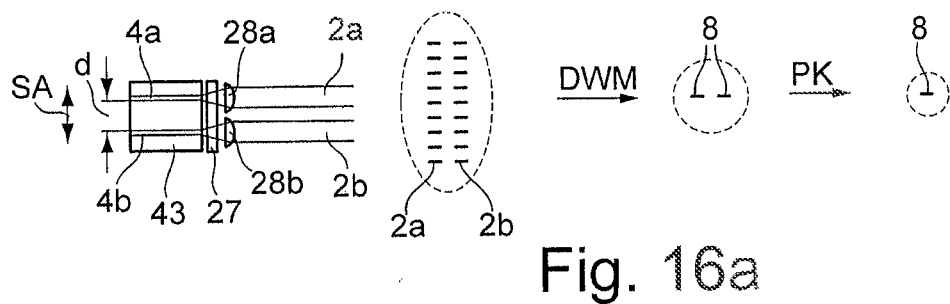
FIGS. 16a and b show representations of two laser emitters that are arranged at a short distance from each other on a common bar.

FIGS. 16a,b show a so-called dual emitter in which exactly two stripe type laser emitters 4a, 4b are structured so that they are spaced apart, in the SA direction on a common laser bar 43. In the embodiment shown in FIG. 16a the laser beams 2a, 2b generated by the two laser emitters 4a, 4b are collimated separately from each in the FA direction and by means of two SA collimation lenses 28a, 28b in the SA direction. A distance d between the laser emitters 4a, 4b in the SA direction is generally between approx. 0.5 mm and approx. 2 mm in the example shown in FIG. 16a.

A plurality of laser bars 43, as shown in FIG. 16a, may be stacked one above the other in the FA direction (perpendicular to the drawing plane), giving rise to the beam profile shown in FIG. 16a. After the wavelength coupling in the FA direction denoted in FIG. 16a by "DWM", a beam profile of the overlapped laser beams 8, which corresponds to the beam emitting profile of an individual laser bar 43 designed as a dual emitter, is generated in the FA direction. Because of overlapping of overlapped laser beams 8 arranged adjacent to each other in the SA direction, for example by means of a polarisation coupling device denoted by "PK" in FIG. 16a, a beam profile can be obtained with a single overlapped laser beam 8 whose beam profile is suitable for coupling into an optical fibre (not shown). It is evident that, contrary to the beam profile shown in FIG. 16a, the distance between the laser bars 43 and hence also the distance between the laser beams 2a, 2b arranged one above the other can vary.

Figure 16B:
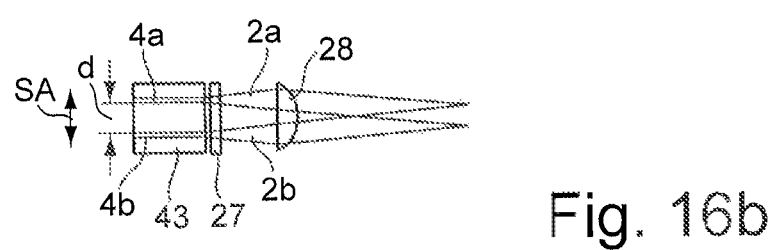

In the embodiment shown in FIG. 16b, only one single SA collimation lens 28 may be used instead of two SA collimation lenses 28a, 28b. The arrangement shown in FIG. 16b has the advantage that only one lens is used and that the distance d between the two laser emitters 4a, 4b can be further reduced, typical values for the distance d ranging from approx. 0.1 mm to 1.0 mm. A further advantage is provided in that the common collimation lens 28 in the SA direction may have a much longer focal length and can therefore achieve better collimation in the SA direction.

FIG. 17 shows a laser bar 43 on whose upper side are arranged eight stripe type laser emitters 4a to 4h (laser diodes). Laser emitters 4a, . . . , 4h each have a stripe width W that is constant except for the sixth laser emitter 4f, with W=5 μm. The sixth laser emitter 4f has a stripe width W' of 10 µm. The stripe width W' of the sixth laser emitter 4f (and, if necessary, of further laser emitters), which deviates from the other laser emitters, can be used to change the beam parameter product to adapt it, for example, to the beam parameter product of an optical fibre, as described in EP 2 088 651 A1.

Except for the first laser emitter 4a and second laser emitter 4b, the laser emitters are arranged at a constant distance D from each other. The distance D' between the first laser emitter 4a and the second laser emitter 4b has, by way of example, been chosen to be longer than the (constant) distance D between all the other laser emitters to prevent crosstalk between adjacent laser emitters 4b, 4c. It is evident that different distances D, D' between more than two, and in particular between all laser emitters 4a, . . . , 4h, can be provided to prevent crosstalk.

The filling factor of the laser bar 43 shown in FIG. 17 is defined as the width W of a particular laser emitter, e.g. the first laser emitter 4a related to the distance D to the laser emitter 4b (here the second) immediately adjacent to it. In the case of the laser bar 43 shown in FIG. 17, the emitter width W, W' and also the distance D, D' of the laser emitters 4a, . . . , 4h vary. The minimum filling factor W/D' is used to calculate the filling factor, i.e. the first laser emitter 4a with the smallest quotient of emitter width W and distance D' to the nearest neighbour (the second laser emitter 4b) defines the filling factor W/D' of the laser bar 43. The laser bar 43 shown by way of example in FIG. 17 has a filling factor of W/D' of over 20%, if necessary of over 25%, and in particular of over 30%. The high filling factor W/D' can be achieved by installing a comparatively large number of laser emitters 4a, . . . 4h with a small emitter width W on the laser bar 43, where the distances D between the laser emitters 4a, . . . , 4h also happen to be short. For example, in the case or a laser bar 43 with a total width of approx. 10 mm and laser emitters 4a, . . . , 4n with a width W of no more than 10 µm, with a number of approx. 300 laser emitters 4a, . . . 4n on the laser bar 43, a filling factor W/D of approx. 25% to approx. 30% can be achieved. If each individual laser emitter 4a, . . . , 4n is operated with a laser power of only approx. 450-500 mW power output, a total power of approx. 120 W per laser bar 43 is obtained.

To obtain the high filling factor indicated above the provision of individual SA collimation lenses may be dispensed with because here the filling factor was limited to approx. 3% to 5% due to the minimum distance of approx. 200 µm that had to be maintained between the array lenses. The laser beams of a plurality (for example eight or twelve) of such laser bars 43 arranged adjacent to each other in the SA direction may be overlapped with an overlapping device to increase the filling factor (e.g. with a diffraction grating). The overlapping may be achieved, for example, in the manner described in connection with FIG. 1, one laser emitter 4a, . . . , 4n shown in FIG. 1 corresponding to one of laser bars 43.

Alternatively an SA transformation lens—if necessary in combination with a beam telescope acting in the SA direction—can be used to focus the laser beams of a laser bar 43 or a plurality of laser bars 43 to the overlapping device, e.g. in the form of the angle-dispersive optical element 7 and improve the feedback efficiency. The beam telescope acting in the SA direction may, for example, have two cylindrical lenses that are arranged in the beam path before the transformation lens acting in the SA direction, which lens can also be designed as a cylindrical lens. Because of the very good beam quality when overlapping in the SA direction, an almost diffraction limited overlapped laser beam can be generated. This beam is characterised by a beam quality factor $M^2$ (see below) smaller than 3, preferably smaller than 2. This results in a total power of the arrangement or device 1 of approx. 1 kW.

As stated above, the emitter width W in a laser emitter 4a, . . . , 4h (stripe emitter) of laser bar 43 is reduced (cf. FIG. 18b) compared to a conventional wide stripe emitter 4a with an emitter width W of over 10 µm, as shown by way of example in FIG. 18a, i.e. it has a width W of 10 µm or less, in particular of 5 µm or less. Laser emitters 4a, . . . , 4h with such a small lateral extension W are typically so-called single-mode emitters whose spectral bandwidth can be stabilised to an extremely narrow line width in the picometer range—at least theoretically—because of the beam parameter product resulting from the small width.

A measure of the focusabiltiy and beam quality represents the (dimensionless) beam quality factor $M^2$ (here: in the SA direction), which designates the angle of divergence of a laser beam compared to the divergence of an ideal Gauβ beam with the same diameter on the beam waist. The higher the beam quality factor $M^2$ (proportional to the beam parameter product), the poorer the focussing of the laser beam. A Gauβ beam has the beam quality factor $M^2=1.0$. For this application, i.e. for obtaining a high filing factor W/D' of over 25%, the individual laser emitters 2a, . . . , 2n of the laser bar 43 typically have a diffraction index $M^2$ in the SA direction of less than 2.0, of less than 1.5, and in particular of less than 1.3. Laser emitters 2a, . . . , 2n with such a diffraction index $M^2$ in the SA direction are (approximately) single-mode emitters which, as indicated above, can be spectrally stabilised to an extremely narrow line width, which has a significant effect on the spectral brilliance.

Because of the spectral stabilisation to a very small line width, the number of laser emitters 4a, . . . , 4h per laser bar 43 that can be coupled by a wavelength overlapping in the SA direction is increased so that despite decreasing power per laser emitter 4a, . . . , 4h, a high power output per wavelength band can be obtained. A further positive effect, which results from reducing the emitting surface per emitter, is the improvement in beam quality. When the laser bar 43 in FIG. 17 is used, the spectral bandwidth can be considerably reduced relative to conventional wide stripe emitters that generally have a bandwidth of approx. 0.3 nm to 0.4 nm, e.g. reduced to approx. 0.1 nm or less, for example.

In addition to the single-mode emitters with a constant stripe width W described above, the values indicated above for the beam quality factor $M^2$ can also be generated with a trapezoid laser emitter 4a shown in FIG. 18c, where both a narrow stripe of constant width $W_f$, which forms a monomode seed area, and an amplifier range with a maximum width $W_A$ trapezoidally expanding in the direction of the beam emitting surface, are arranged on a semiconductor chip. An emitter with a beam quality factor $M^2$ in the value range indicated above may also be designed in the form of a so-called Z-laser or as a surface emitter (e.g. VCSEL, VECSEL).

FIG. 19 shows a beam forming device 50, which is used to form a beam profile that in this example consists of a single overlapped laser beam 8. The forming of a beam profile is favourable for increasing the efficiency of the coupling of the laser radiation generated by the device 1 into an optical fibre "LLK". To form the beam profile the beam forming device 50 has a beam splitter device that consists of two transmitting plates 51a, 51b arranged at an angle relative to each other, which plates cut the overlapped laser beam 8 into two partial beams 8', 8" and offset them relative to each other in the FA direction, as shown in FIG. 20.

The two partial beams 8', 8" offset relative to each in the FA direction are offset relative to each other by means of a device for spatial rearrangement of the partial beams 8', 8", which is formed in this example by a second stack with plates 52a, 52b rotated against each other, which stack is rotated 90° to the first two plates 51a, 51b. In this manner a beam profile is generated in which the two partial beams 8', 8" are stacked one above the other in the FA direction, as can also be seen in FIG. 20. As an alternative to using a beam splitter device in the form of the first two first plates 51a, 51b, cutting of the overlapped laser beam 8 can also be achieved by means of a perforated or edge mirror, or two plates with parallel mirror surfaces can be used, as described in U.S. Pat. No. 5,825,551.

Moreover, the spatial rearrangement of the partial beams or of a plurality of overlapped laser beams (in the case of a corresponding beam profile with a plurality of overlapped laser beams) can be achieved not only by means of a plurality of plates 52a, 52b rotated against each other, but stepped mirrors, for example, can also be used for this purpose. In addition or as an alternative to the spatial rearrangement, two or more overlapped laser beams 8 or partial beams 8', 8" can be overlapped, e.g. by means of a polarisation coupling device in the manner of a dielectric mirror or the like. The device for overlapping, for example in the form of a polarisation coupler, combines the two overlapped laser beams or partial beams 8', 8" to form one laser beam.

A transformation device may also be provided for altering or rotating the orientation of one or more of the overlapped laser beams as a component of the beam forming device. For example, the orientation of the overlapped laser beam or beams 8 or of partial beams 8', 8" can be rotated by 90° in this way so that a horizontal orientation of the beam cross-section of an overlapped laser beam 8 or partial beam 8', 8" can be converted to a vertical orientation or vice versa.

As an alternative to the use of plates 51a, 51b, one or more trapezoid plates can also be used as a beam splitter device for generating two or more partial beams 8', 8" from the overlapped laser beam 8. The trapezoidal plates or, as the case may be, a plate that has two or more trapezoidal segments that is struck by the overlapped laser beam 8, enables the overlapped laser beam 8 to be cut into two or more partial beams 8', 8" without edge losses. The partial beams 8', 8" may then be rearranged, for example, by means of an optical rotator or a stepped mirror to form a beam profile that is symmetrical in terms of beam quality.

As explained above, the overlapped laser beam or beams 8 (or partial beams 8', 8") can be coupled into optical fibres LLK and can be used directly or via a suitable beam guidance for material processing. As the case may be, the laser radiation can also be used for pumping a further laser, for example a solid state laser, which can also be used for material processing or for other applications (marking, etc.). The beam guidance of the pump radiation can be provided by means of absorbers, beam switches, beam splitters, etc. It is also possible to measure and if necessary control the power of the laser radiation supplied by the device 1.

What is claimed is:

1. A device for wavelength coupling of laser beams ($2a, \ldots, 2n$) with different wavelengths ($\lambda_1, \ldots, \lambda_n$), comprising:
   at least one laser source for generating a plurality of laser beams ($2a, \ldots, 2n$);
   an overlapping device for spatial overlapping of the plurality of laser beams ($2a, \ldots, 2n$) for forming an overlapped laser beam with a plurality of the different wavelengths ($\lambda_1, \ldots, \lambda_n$);
   a feedback device arranged in a path of the overlapped laser beam for feeding a radiation proportion of the overlapped laser beam back to the laser source; and
   a phase correction device for phase correction of the radiation proportion reflected back to the laser source,
   wherein the feedback device is configured as an output coupling element with a surface partially reflecting the overlapped laser beam, and wherein the partially reflecting surface of the output coupling element has a curvature for the phase correction of the radiation proportion reflected back to the laser source.

2. The device according to claim 1, further comprising:
   a feedback device arranged in a beam path between the laser source (3) and the overlapping device for feeding a radiation proportion of the laser beams to be overlapped ($2a, \ldots, 2n$) back to the laser source,
   the feedback device comprising a partially reflecting angle-dispersive optical element.

3. The device according to claim 2, further comprising: at least one imaging optical element arranged between the laser source and the partially reflecting angle-dispersive optical element for the spatial overlapping of the laser beams ($2a, \ldots, 2n$) of the laser source on the partially reflecting angle-dispersive optical element.

4. The device according to claim 2, wherein the partially reflecting diffraction grating is arranged at the Littrow angle ($\alpha_{L1}, \ldots, \alpha_{Ln}$) to the striking laser beams ($2a, \ldots, 2n$).

5. The device according to claim 2, wherein the partially reflecting angle-dispersive optical element comprises a partially reflecting diffraction grating.

6. The device according to claim 1, wherein the overlapping device comprises a diffraction grating.

7. The device according to claim 6, wherein a grating constant ($g_1$) of the partially reflecting diffraction grating of the feedback device and a grating constant ($g_2$) of the diffraction grating of the overlapping device are matched to each other so that the overlapped laser beam leaves the diffraction grating of the overlapping device at essentially the same emergent angle ($\beta$).

8. The device according to claim 7, wherein the diffraction grating of the feedback device and the diffraction grating of the overlapping device are aligned parallel with each other and the overlapped laser beam leaves the diffraction grating of the overlapping device at an emergent angle ($\beta$) of essentially 0°.

9. The device according to claim 7, wherein the following applies to the grating constant g2 of the diffraction grating of the overlapping device and to the grating constant g1 of the partially reflecting diffraction grating of the feedback device: $m_2/g_2 = m_1/2\ g_1$ wherein $m_2$ denotes a diffraction order of the diffraction grating of the overlapping device and $m_1$ denotes a diffraction order of the partially reflecting diffraction grating of the feedback device.

10. The device according to claim 7, wherein the partially reflecting diffraction grating of the feedback device and the diffraction grating of the overlapping device are designed as a common optical element.

11. The device according to claim 7, wherein a beam telescope is arranged between the partially reflecting diffraction grating of the feedback device and the diffraction grating of the overlapping device.

12. The device according to claim 11, wherein the following applies to the grating constant g2 of the diffraction grating of the overlapping device and the grating constant g2 of the partially reflecting diffraction grating of the feedback device: A $m_2/g_2 = m_1/(2 g_1)$, where $m_1$ denotes a diffraction order of the partially reflecting diffraction grating of the feedback device, m2 denotes a diffraction order of the diffraction grating of the overlapping device and A denotes an imaging ratio of the beam telescope.

13. The device according to claim 1, wherein the overlapping device is configured as a diffraction grating which is rotatably mounted about an axis of rotation for altering the wavelengths ($\lambda_1 \ldots, \lambda_n$) of the laser beams (2a, . . . , 2n) to be overlapped.

14. The device according to claim 1, wherein a polarisation filter is arranged between the light source and the feedback device.

15. The device according to claim 14, wherein the polarisation filter and the overlapping device or the polarisation filter and the feedback device are configured as a common optical element.

16. The device according to claim 14, wherein the polarisation filter is arranged in a beam path between the overlapping device and the feedback device.

17. The device according to claim 1, wherein a phase correction element of the phase correction device and the feedback device are configured as a common optical element.

18. The device according to claim 1, wherein the output coupling element is configured for beam forming the outcoupled overlapped laser beam.

19. The device according to claim 1, wherein the phase correction device has an imaging optical element for the collimation of the overlapped laser beam to the partially reflecting, flat surface of the output coupling element, wherein the radius of curvature ($R_K$) of the imaging optical element is adapted to the radius ($R_p$) of the phase curvature of the overlapped laser beam.

20. The device according to claim 1, wherein the overlapping device and the feedback device are configured as a common optical element.

21. The device according to claim 20, wherein the overlapping device and the output coupling element are configured as the common, optical element.

22. The device according to claim 1, further comprising: a first imaging optical element arranged in the beam path between the laser source and the overlapping device, which element, together with a second imaging optical element arranged in the beam path between the laser source and the overlapping device, forms a beam telescope.

23. The device according to claim 1, further comprising: an imaging optical element arranged in the beam path between the laser source and the overlapping device, which element, together with an imaging optical element arranged in the beam path of the overlapped laser beam, forms a beam telescope.

24. The device according to claim 1, further comprising: a beam deflection device for aligning the laser beams (2a, . . . , 2n) to be overlapped to a common overlapping area of the overlapping device or of the feedback device.

25. The device according to claim 24, wherein the beam deflection device has at least one facet element with a plurality of facets for aligning a respective laser beam (2a, . . . , 2n) to the common overlapping area.

26. The device according to claim 24, wherein the beam deflection device has a plurality of deflection mirrors (22a, . . . , 22n) for aligning the laser beams (2a, . . . , 2n) to the common overlapping area.

27. The device according to claim 24, further comprising: a transformation device for rearranging the laser beams (2a, . . . , 2n) of the laser source and/or for rotating the orientation of the laser beams (2a, . . . , 2n) of the laser source.

28. The device according to claim 27, wherein a collimation lens for collimating a plurality of laser beams (2a, . . . , 2n) running in a common plane (X, Y) and emitted by the laser source is oriented at an angle ($\phi$) to the common plane (X, Y), and wherein the collimation lens together with the transformation device designed for rotating the orientation of the laser beams (2a, . . . , 2n) effects an alignment of the laser beams (2a, . . . , 2n) to a common overlapping area.

29. The device according to claim 24, wherein at least one laser source has at least one optical module (25, 25a, . . . , 25n) with a plurality of laser emitters (26a, . . . , 26n) for generating a beam emitting profile with the laser beams (2a, . . . , 2n) arranged adjacent to each other in one direction (SA, FA).

30. The device according to claim 29, wherein the plurality of laser emitters (26a, . . . , 26n) are arranged in a first direction (X) and in a second direction (Z) perpendicular to the first, offset relative to each other, and wherein the optical module has a beam deflection device (22a, . . . , 22n) for generating the beam emitting profile with the plurality of laser beams (2a, . . . , 2n) arranged adjacent to each other in one direction (FA).

31. The device according to claim 29, wherein at least two optical modules are stacked one above the other.

32. The device according to claim 29, wherein at least two of the optical modules (25a, . . . , 25n) are arranged on a common arc.

33. The device according to claim 29, further comprising: an optical device for increasing the filling factor of the plurality of laser beams (2a, . . . , 2n) generated by two or more different optical modules (25a, . . . , 25n).

34. The device according to claim 33, wherein the optical device comprises at least one slit mirror.

35. The device according to claim 33, wherein the optical device comprises at least one deflection device.

36. The device according to claim 33, wherein exactly two laser emitters are arranged on a common laser bar of the laser source.

37. The device according to claim 33, wherein at least one laser source has a plurality of laser emitters (4a, . . . , 4n) which are arranged at a constant distance (W) or non-constant distance (W, W', . . . ) on a common laser bar.

38. The device according to claim 37, wherein the laser bar has a filling factor (W/D) of over 20%.

39. The device according to claim 37, wherein the laser emitters (4a, . . . , 4n) of the laser bar have a beam parameter product of less than 2.0.

40. The device according to claim 37, wherein the laser emitters (4a, . . . , 4n) have a width (W, W') of 10 µm or less.

41. The device according to claim 37, further comprising: a beam forming device for forming a beam profile of at least one overlapped laser beam.

42. The device according to claim 41, wherein the beam forming device has a device for the spatial rearrangement with or without beam rotation and/or for overlapping at least two overlapped laser beams and/or at least two of the partial beams (8', 8").

43. The device according to claim 41, wherein the beam forming device has a beam splitter device for cutting one of the overlapped laser beams into at least two partial beams (8', 8").

44. The device according to claim 33, wherein at least one laser source has a plurality of laser emitters (4a, . . . , 4n)

which are arranged on a common laser bar and have a constant width (D) or a non-constant width (D, D', . . . ).

45. The device according to claim 1, wherein the partially reflecting surface of the output coupling element has a cylindrical or spherical curvature.

46. The device according to claim 45, wherein the cylindrical or spherical curvature of the partially reflecting surface of the output coupling element is adapted to a cylindrical or spherical curvature of a phase front of the overlapped laser beam.

* * * * *

UNITED STATES PATENT AND TRADEMARK OFFICE
CERTIFICATE OF CORRECTION

PATENT NO. : 9,690,107 B2
APPLICATION NO. : 13/833974
DATED : June 27, 2017
INVENTOR(S) : Viorel C. Negoita et al.

It is certified that error appears in the above-identified patent and that said Letters Patent is hereby corrected as shown below:

In the Claims

Column 32, Line 49, Claim 9, replace "g2" with --$g_2$--;

Column 32, Line 50, Claim 9, replace "g1" with --$g_1$--;

Column 32, Line 52, Claim 9, replace "=$m_1$/2 $g_1$" with --=$m_1/(2\ g_1)$,--;

Column 32, Lines 65 and 66, Claim 12, replace "g2" with --$g_2$--;

Column 33, Line 3, Claim 12, replace "m2" with --$m_2$--; and

Column 33, Line 41, Claim 21, replace "common," with --common--.

Signed and Sealed this
Ninth Day of April, 2019

Andrei Iancu
*Director of the United States Patent and Trademark Office*